United States Patent [19]
Frankovitch, Jr. et al.

[11] Patent Number: 5,923,161
[45] Date of Patent: Jul. 13, 1999

[54] GRAPHICAL DISPLAY DEVICE

[75] Inventors: Ed Frankovitch, Jr., Coatesville, Pa.;
Robert J. Wieners, Wrentham, Mass.

[73] Assignee: Universal Enterprises, Inc., Beaverton, Oreg.

[21] Appl. No.: 08/843,273

[22] Filed: Apr. 14, 1997

[51] Int. Cl.$^6$ .................... G01R 13/28; G01R 35/00
[52] U.S. Cl. .............. 324/115; 324/121 R; 324/130; 324/379
[58] Field of Search .................. 324/121 R, 130, 324/115, 379

[56] References Cited

U.S. PATENT DOCUMENTS

| | | |
|---|---|---|
| 2,963,652 | 12/1960 | Taylor et al. . |
| 3,789,658 | 2/1974 | Olsen . |
| 5,155,431 | 10/1992 | Holcomb .......................... 324/121 R |
| 5,184,062 | 2/1993 | Ladwig ............................ 324/121 R |
| 5,397,981 | 3/1995 | Wiggers ........................... 324/121 R |
| 5,517,105 | 5/1996 | Holzwarth ....................... 324/121 R |
| 5,585,552 | 12/1996 | Heuston et al. . |
| 5,629,615 | 5/1997 | Nita ................................. 324/121 R |

OTHER PUBLICATIONS

HP Catalog–1992–54501/10 Oscilloscopes–pp. 148–149.
OTC Vision Lab Scope DMM Module Information Brochure (Feb. 1995).
2 Channel Automotive Oscilloscope LS2000 Brochure, Nov. 1994.
Fluke's 860 Series GMM Brochure, 1994.

*Primary Examiner*—Josie Ballato
*Assistant Examiner*—Jose M. Solis
*Attorney, Agent, or Firm*—Chernoff, Vilhauer, McClung & Stenzel, LLP

[57] ABSTRACT

A measuring device displays waveforms representative of electrical signals and includes a selector, at least one input terminal, and a graphical display. The graphical display is suitable to view a waveform thereon. The measuring device receives an electrical signal from the input terminal and displays a first waveform on the graphical display representative of the electrical signal. The selector is selectable to one of a plurality of positions and the measuring device selects a set of waveform data in response to each of the positions. The measuring device displays a second waveform on the graphical display representative of the waveform data.

5 Claims, 31 Drawing Sheets

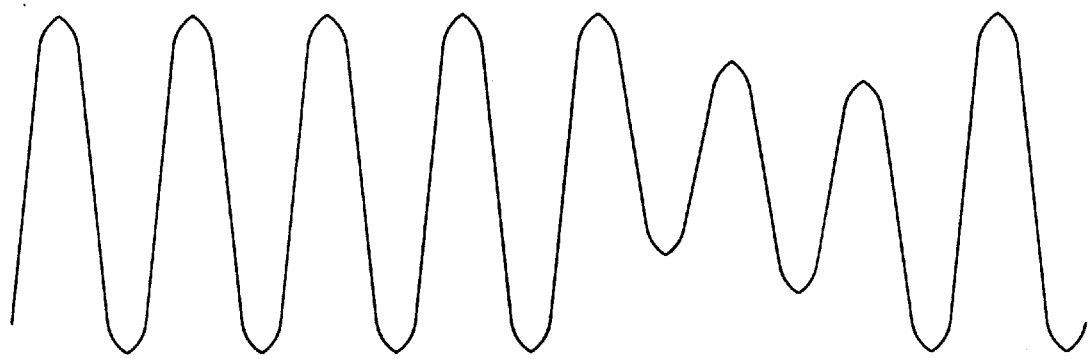
FIG. 9
117 VOLTS
FIG. 10
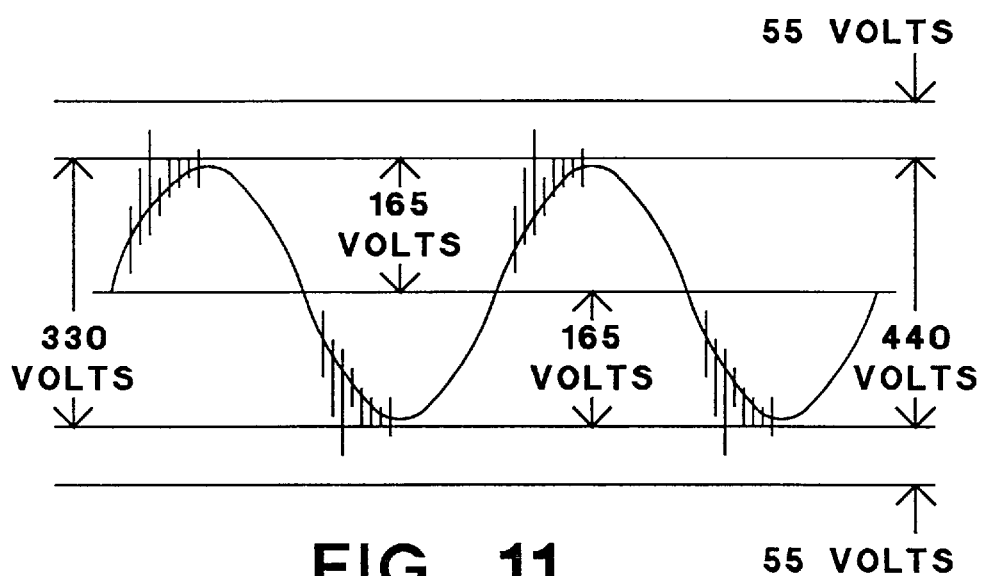
FIG. 11

GRAPHICAL DISPLAY DEVICE

BACKGROUND OF THE INVENTION

The present invention relates to a graphical measuring device to simplify the operation of measuring electrical signals.

An oscilloscope is a device which displays a graph of voltage or current over time. In order to display meaningful information, the oscilloscope must be configured to measure voltage or current over a meaningful range of magnitudes during a proper time duration. The start of the time period for measuring voltage or current must be selected by choosing a proper triggering event based on the anticipated electrical signal to be measured. The triggering event may include the trigger level voltage and the trigger slope. For example, a triggering event could be a voltage signal rising above 0.1 volts. The time duration and voltage range should be selected so that a full electrical signal (waveform) is visible on the display. To make a meaningful interpretation of the displayed waveform, the user must know what the waveform should look like.

For example, if the user is measuring a square wave signal that varies between 0.01 volts to 0.06 volts every 100 microseconds, then it would be useless to view the square wave signal on a voltage scale set to display signals between 0 to 0.005 volts. Also, it would not be optimal to measure the square wave signal over a time duration of 10 microseconds. Further, if the triggering event was set to sense an increasing signal greater than 0.1 volts, then the square wave signal would never trigger the device and hence no waveform would be displayed. It is apparent that to simply make a proper measurement, the user must select the scaling, time duration, trigger level voltage, and the trigger slope, all for an electrical signal for which the user presumably has a prior knowledge of its characteristics. If the user does not know or can recall the anticipated signal's characteristics then the process to properly sense and display a waveform requires experimentation in an attempt to set all parameters. This experimentation may require considerable time and be frustrating to the user.

For the aforementioned example, a properly configured measuring device should have the voltage scale range set to 0 to 0.1 volts to permit viewing the height of the entire waveform. The time period should be set to either 500 or 1000 microseconds so that at least one entire waveform time period is displayed. The triggering event could be selected to trigger with an increasing voltage over 0.015 volts, which is above the minimum anticipated voltage of 0.01 volts. The trigger slope, if needed, would be set accordingly.

Many technicians, including automobile technicians, are likely to be unfamiliar and untrained with respect to the proper operation of such an oscilloscope. With all their other concerns, it is a time consuming burden for such technicians to be properly trained to correctly configure an oscilloscope to perform various tests and measurements. In particular for automotive technicians, many tests have become necessary with the advent of microchip controllers within automobiles.

A traditional desktop oscilloscope may be used by technicians to display measurements for testing and troubleshooting. However, as previously explained, many technicians may be unfamiliar with the proper operation of an oscilloscope. Further, it is burdensome for the technician to move desktop oscilloscopes to remote testing locations to take measurements.

Fluke Corporation of Everett, Washington, has designed and is marketing a handheld 860 series GMM (Graphical Multimeter) that displays electrical waveforms in a manner similar to that of a desktop oscilloscope. However, unlike an oscilloscope, the 860 series GMM is not capable of sampling at over 100,000 Hz which provides an inadequate sampling rate for many applications. In essence, the graphical multimeter is best at sensing the general trends of electrical signals. In general, oscilloscopes sample at rates in excess of 1 MHz and thereby can display transients of electrical signals that the 860 series GMM, and similar graphical meters, are incapable of doing. Most oscilloscopes operate at frequencies of 5 MHz or more. Like an oscilloscope, Fluke's 860 series GMM is complicated to configure, particularly when used by an untrained technician unfamiliar with its operation. Accordingly, for technicians, and in particular automobile technicians, a graphical measuring device that is easy to configure to perform tests and measurements is desirable. Furthermore, if the technician does manage to properly configure the measuring device, the technician may still be unable to interpret the meaning of the waveform, for example, whether or not the waveform indicates the existence of a problem, without prior knowledge of how a proper waveform should appear.

Olsen U.S. Pat. No. 3,789,658 discloses an automobile engine performance analyzer which includes an oscilloscope and three selectable scale test meters for displaying certain operating characteristics of an engine under test. In particular, a program switch is provided with a rotary selector knob for positioning the switch at any selected position for measuring and displaying one of the characteristics A-L. However, the oscilloscope uses the same scaling of the graphical display for all the different tests. This does not allow optimum viewing of all waveforms (if any waveform is displayed at all), because each waveform may have a different magnitude, time duration and trigger point.

What is desired, therefore, is an interface for a graphical display device that frees the user from setting the scaling, time duration, trigger level voltage, and trigger slope for one or more user-selected tests. Furthermore, the display device should assist the user in determining whether the displayed waveform is correct.

SUMMARY OF THE PRESENT INVENTION

The present invention overcomes the aforementioned drawbacks and shortcomings of the prior art by providing a measuring device that displays waveforms representative of electrical signals that includes a selector, at least one input terminal, and a graphical display suitable for viewing a waveform thereon. In a first aspect of the present invention, the measuring device receives an electrical signal from the input terminal and displays a first waveform on the graphical display which is representative of the electrical signal. The selector typically may be in the form of a rotary selector knob cooperating with a dial containing indicia associated with respective angular positions thereon. The selector is moveable to one of a plurality of positions and the measuring device then selects waveform data in response to the respective position chosen. The measuring device then may display a second waveform on the graphical display which is taken from a reference waveform data library and is representative of the waveform data type selected.

The first waveform and second waveform may be simultaneously displayed on the graphical display. By displaying the second waveform, preferably indicative of a reference signal, the user can visually compare his measured signal (first waveform) to the reference waveform (first waveform) to assist in troubleshooting and testing determinations.

In a second aspect of the present invention, the measuring device is selectable to one of a plurality of positions and the measuring device selects trigger data and scaling data in response to each of the positions. The measuring device receives an electrical signal from the input terminal and displays a received waveform representative of the electrical signal on the display where the measuring device is configured in accordance with the trigger data and scaling data.

Selecting the appropriate scaling data and trigger data for the measuring device by different selector positions permits the user to simply select the test to be performed and the measuring device is consequently automatically configured. This alleviates the user from the necessity of being familiar with the operation and configuration of the measuring device aside from simply choosing the appropriate test to be performed.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 9 is a waveform illustrating a faulty ABS signal.

FIG. 10 is a current value of a current waveform displayed on a multimeter.

FIG. 11 is the current waveform of FIG. 10 displayed on the measuring device of FIG. 1.

DETAILED DESCRIPTION OF THE PREFERRED EMBODIMENT

Traditional oscilloscopes are designed as general purpose devices with extensive functionality and versatility but, as previously described, technicians may be unfamiliar with its operation and hampered by the versatility of such instruments. To cater to the need for a powerful yet simple to use measuring device, an interface is needed to free up the technician from the complicated details regarding the device's operation. An important consideration accomplished by the user interface of the present invention is that the measuring device may be specifically designed to exploit the fact that there are typically only a limited number of measurements that are performed by a specialized technician, such as an automobile technician. Ideally, the measuring device should permit the technician to merely identify the particular test to be performed and the measuring device would then properly sense and display the waveform of the electrical signal associated therewith. To sense an electrical signal which has predetermined characteristics, a proper trigger level voltage and trigger slope should be automatically selected by the measuring device. In addition, to properly display the electrical signal the measuring device should automatically select a proper voltage (or current) range and time period.

Initially, a general overview of the functionality of the measuring device is provided. Next, a more detailed discussion of the actual operation of the measuring device is provided. Finally, the actual circuit diagrams for the measuring device are provided.

GENERAL OVERVIEW

Figure 1:
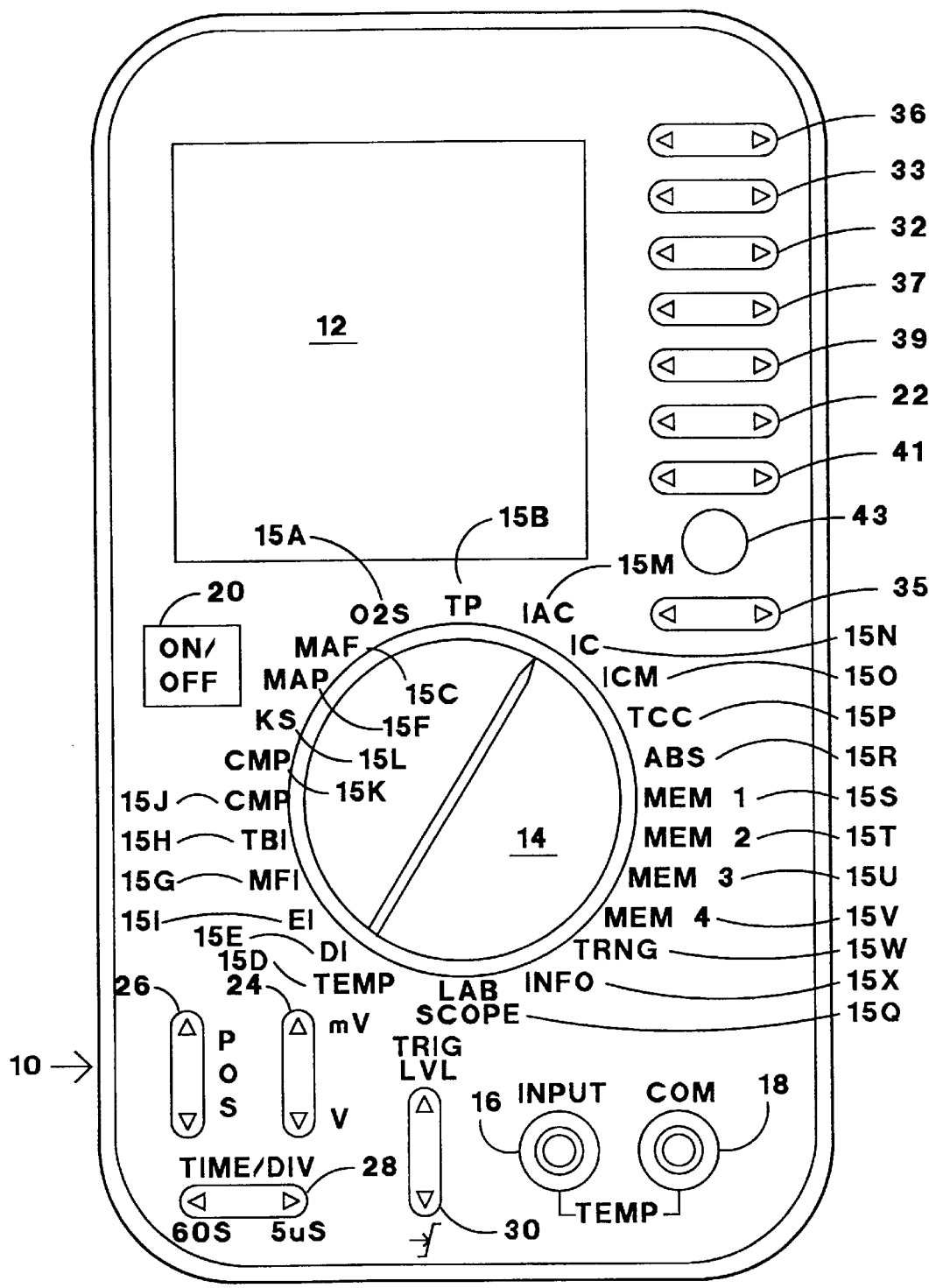
FIG. 1 is a pictorial front view of a measuring device that includes a user interface constructed in accordance with the present invention.

Referring to FIG. 1, the measuring device 10, which is preferably an oscilloscope, is a portable battery-powered handheld device to facilitate making measurements at remote locations. For an automotive technician, only about sixteen measurements, one for each of the vehicle's diagnostic sensors feeding into the vehicle's computers, are typically performed. It turns out that the shape of the voltage and/or current signals detected by these sensors, when measured over a time period, varies little among different vehicles. Moreover, the electrical signals that need to be observed do have steady state and transient characteristics which require a fast sampling rate in order to obtain an accurate waveform. The sampling rates of graphical multimeters are not fast enough to provide a waveform with sufficient fidelity for such automotive testing. Accordingly, an oscilloscope which has a much higher sampling rate is necessary to properly sense and display the electrical signals of the vehicle's sensors and computers. (However, where the required sampling rates for the particular application are significantly lower, a graphical multimeter or some other measuring device may be adequate.)

The oscilloscope 10 preferably has about the same size, shape, and appearance as a handheld multimeter to provide portability and maintain its familiarity in appearance with technicians that are already familiar with such instruments. A graphical display 12 is located at the upper center of the oscilloscope 10. Centrally located on the oscilloscope 10 is a rotary snap-to dial 14, which in the exemplary embodiment shown has twenty-four selectable positions 15a–15x. The dial 14 may be chosen with any suitable number of positions for the particular application. The presence of the dial 14 makes the oscilloscope 10 appear familiar and acceptable to technicians who are familiar with multimeters.

The dial 14 provides an aspect of the user interface to simplify the operation of the oscilloscope 10 for a technician. Each position of the dial is programmed to correspond to a particular test that is frequently performed by the technician. As shown in FIG. 1, sixteen of the twenty-four selectable positions correspond to individual electrical tests 15a–15c, 15e–15p, and 15r typically performed by an automotive technician in vehicle diagnostic and repair work. The seventeenth position 15q permits the oscilloscope 10 to operate in the same manner as traditional oscilloscopes, as will be described in detail later. Turning the dial 14 to one of the sixteen positions corresponding to a respective one of the automotive tests, configures the oscilloscope to properly sense and display the anticipated electrical signal. The configuration performed by the oscilloscope includes automatically selecting the scaling (voltage or current), time duration, trigger level voltage, trigger mode, and trigger slope for the anticipated electrical signal corresponding to the dial's selected position. In this manner, the technician only needs to select the desired test as indicated by the dial 14, and the oscilloscope 10 is then automatically configured to properly sense and display the anticipated electrical signal.

To measure the electrical signal an active lead is attached to input port 16. A common lead provides a point of comparison for the active lead potential and is connected to common port 18. For most measurements the common lead is generally connected to ground. The off-on switch 20 permits the oscilloscope to be turned off and on. When pressed, the freeze/run button 22 stops the movement of waveforms on the display 12 and displays the waveform currently on the display as a still frame until the freeze button is pressed again. As is conventional, the freeze button allows time for the technician to examine the waveform.

Brief descriptions of several of the measurements typically associated with automobile sensors, as indicated around the dial 14, are as follows. The remaining measurements are described later in the detailed description of the preferred embodiment.

O2S(15a) The measurement of oxygen in the exhaust stream. If the automobile is operating properly, the electrical signal should be a slow sine wave varying between 100 and 900 millivolts and centered at approximately 450 millivolts.

TP(15b) The throttle position sensor provides a measurement of the opening of the fuel throttle plate. As the accelerator pedal is depressed, a potentiometer is turned, resulting in a greater voltage across the potentiometer and thus a greater throttle aperture. When the potentiometer is worn, spikes or glitches may occur as the accelerator is depressed. When operating properly, the measured voltage should rise smoothly from 0 to 5 volts as the accelerator is depressed.

MAF(15c) The measurement of the airflow into the engine. When operating properly the measured signal should be a 0 volt to 5 volt square wave with frequency proportional to the air flow measured.

MAP(15f) The manifold absolute pressure of the air pressure at the manifold. The measured signal should be a square wave with a frequency that is proportional to the pressure.

MFI(15g) The port fuel injector measures the voltage at fuel injector opening. The port fuel injector measurement may include spikes up to 100 volts.

TBI(15h) The peak and hold fuel injector measures the voltage at the fuel injector opening for peak and hold variety injectors which peak twice.

LAB Scope(15q) This position allows the user the full flexibility generally available with an oscilloscope.

The following controls are available when the dial 14 is in the LAB Scope 15q position in addition to the remaining positions.

The volts per division button 24 sets the voltage (vertical) range of the oscilloscope 10 in terms of volts per horizontal division. In this instance a dual button 24 is provided, where pressing the top end of the button 24 decreases the scale and pressing the bottom end of the button 24 increases the scale. The scaling may use a one-two-five sequence if desired. Such a sequence may include 1 millivolt; 2 millivolts; 5 millivolts; 10 millivolts; 20 millivolts; 50 millivolts; 100 millivolts; 200 millivolts; 500 millivolts; 1 volt; 2 volts; 5 volts; 10 volts; 20 volts; 50 volts.

The position button 26 establishes the zero volt position on the vertical scale. For some measurements it would make sense for zero volt position to be at the very bottom of the scale (i.e. in the case where the voltage always exceeds zero), whereas for other measurements zero volt position should be in the middle of the vertical scale (i.e. for the cases where the voltage is centered at zero).

The Time/Div button 28 allows the user to set the time scale (horizontal) in terms of time per division. If the voltage varies over the course of milliseconds, this should be set to view several cycles of the repetitive waveform.

The trigger setting button 30 permits the triggering event that starts the scan to be fixed by the technician. In a typical implementation, the scan is always set to begin when the voltage increases above some predetermined amount. Alternatively, the trigger button could be configured to trigger on any other condition. The trigger feature allows a stable image to appear on the oscilloscope 10 and permits the capture of a rare event.

The stored/live WFM button 32 allows the user to select the stored reference signal, described later, or the live image. When the button 32 is in "live" position, the other buttons act to adjust the live signal display.

As previously mentioned, the sensing and displaying of electrical signals corresponding to each of the dial positions frees the user from configuring the oscilloscope. However, the user may still not be able to interpret the displayed waveform, or know how it should properly appear. To assist the user, a reference (i.e., exemplary) waveform corresponding to each test position on the dial is shown on the display when the dial is turned thereto. Each position on the dial corresponding to a particular test selects a set of waveform data from the internal memory of the oscilloscope which is representative of the reference waveform to be displayed. The oscilloscope then depicts this reference waveform on the display. The waveform data preferably includes more than merely the graphical image of the reference waveform. For example, the waveform data should also include the scaling data (voltage or current) and time duration data to properly configure the oscilloscope to display the reference waveform and to also properly display the sensed (live) waveform. Additionally, the waveform data should include the trigger level voltage, trigger mode, and trigger slope so that all the proper settings are available for sensing and displaying the anticipated electrical waveform from the vehicle microchip or other test location. In other words, the reference waveform data selected by positioning the dial 14 will be displayed and the oscilloscope is properly configured to sense and also display the "live" electrical signal corresponding to the reference waveform. Preferably, the reference waveform and the live (actual) waveform are both displayed at the same time. However, if desired, a toggle switch may be used to select between the two waveforms. With both waveforms available, the user may compare the live waveform with the reference waveform to determine if the live waveform is proper.

An alternative to the dial 14 is to use one or more buttons to permit the user to scroll through test options that are preferably simultaneously displayed on the display and select the desired test. However, such a display system requires the pressing of several buttons to select the desired test and the user is more likely to inadvertently select the wrong test than if a rotary dial selector is used.

Figure 2:
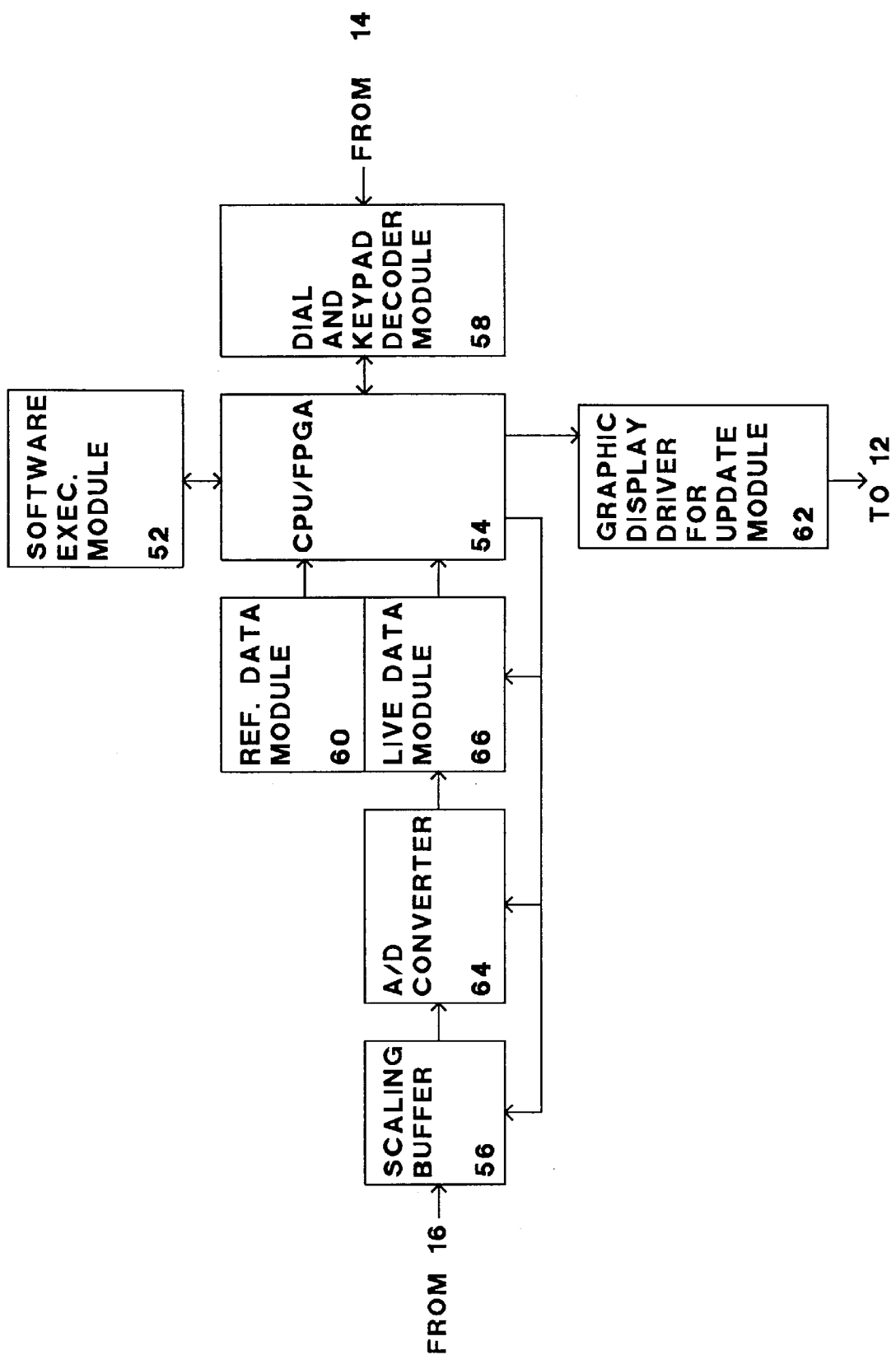
FIG. 2 is an operational flow diagram of the measuring device and user interface shown in FIG. 1.

Referring to the operational flow diagram of FIG. 2, as the user turns the dial 14 to the desired position, CPU/FPGA Module 54 detects the change in position. The Software Executive Module 52 decodes this change and determines which of the settings is desired. The CPU fetches the corresponding reference data from Reference Data Module 60, formats this data and sends this formatted data to the Graphic Display Driver and Update Module 62, which in turn displays the reference waveform on the Display 12. The graphical data includes the name of the reference waveform and set up information for the live waveform display. In addition, CPU/FPGA Module 54 outputs control and timing signals to a Scaling Buffer 56, A/D Module 64, and Live Waveform Data Module 66. These signals select the proper voltage scale, trigger level voltage, trigger slope, trigger mode, and time duration so that the Input Port 15 may properly sense the anticipated electrical signal and thereafter properly display it on the Display 12. The digital data from the live waveform data module is passed to the CPU/FPGA, which in turn properly formats the data and sends this formatted data to the Graphic Display driver and Update Module 62. Both waveforms may be shown side-by-side, or up-and-down, or superimposed on-top-of-each-other on the display 12.

DETAILED DISCUSSION OF THE ACTUAL OPERATION

Automotive electrical problems can be divided into several categories. Depending on the system in the vehicle causing the trouble, the real problem may exist in one system, while the symptoms being tested appear in another. An oscilloscope can help isolate the real cause of a particular problem.

For many years oscilloscopes have been used in the world of electronics. At first they were (and still are) used in the design phase of many electronic systems. Then, their usefulness became even more important for diagnosing and repairing electronic devices (especially out in the field, far from the resources of factories and personnel).

Technicians realized early that trying to troubleshoot many automotive electronic systems without oscilloscopes was equivalent to trying to drive a car with eyes covered. Oscilloscopes have been used to repair may types of electronic devices like TV's, VCR's, computers, and copiers.

The use of the oscilloscope is not limited to the electronics world. With the appropriate transducer, an oscilloscope can measure almost any kind of physical phenomena. A transducer is a device that produces electrical energy in response to some kind of physical energy. As an example, a detonation or "knock" sensor on an engine is a transducer. A typical knock sensor contains a piezoelectric crystal that produces an electrical signal when it is subjected to mechanical stress, i.e., the engine knocking.

For years, "Ignition Scopes" were used to display secondary ignition patterns from conventional ignition systems. Secondary ignition patterns can be viewed on oscilloscopes. However, many other patterns, signals, and sensor outputs need to be checked on the vehicles being built today. The only way to determine if any of these circuits are performing properly is to use an oscilloscope.

There are typically four basic elements that make up a complete electric circuit. They are the energy source, the conductor or circuit wiring, the circuit load or device, and the control (which, can be optional). In a complete circuit, all of the current that leaves a power source also returns back to the power source.

Current represents the movement of electrons through an electric circuit. The amount of electrical current flow is measured in Amperes (usually shortened to Amps). The symbol for Amperes or Amps is the letter "I". Many vehicle electronic circuits use only milliamps of current to operate. (A milliamp is $\frac{1}{1000}$th of an Ampere.) The symbol for milliamp is "mA".

Resistance is the opposition or restriction to current flow in a circuit. Electrical resistance is measured in terms of "Ohms". Every part of any electrical circuit has resistance, including the wiring to and from that circuit. Lights, relays, and electronic devices in a circuit are often referred to as the "Load" and all have some resistance, called the "Load Resistance". Resistance in a wire can be affected by a number of things including the wire length, the wire diameter, the wire type, the temperature, and the condition of the wire.

The reason that current flows from the battery, through the circuit, and back to the battery is because of a force called the "Electromotive Force", or "emf". The total amount of electromotive force, or difference in potential, that is present is measured in terms of "Volts" or "Voltage" using the symbol "E". A typical vehicle battery has a difference in potential electromotive force between its positive and negative terminals of just over twelve volts. A battery provides this voltage by a chemical reaction that takes place inside the battery. In contrast, an alternator needs mechanical movement of a wire through a magnetic field in order to produce this voltage.

A vehicle battery supplies what is called "Direct Current" or "DC", and the current flows in one direction. Conventional theory, used by the automotive industry, is that current flows from the positive terminal, through the circuit, and to the negative terminal. On the other hand, "Alternating Current" or "AC" first flows in one direction, then "alternates" and flows in the opposite direction. This happens continuously many times per second. The electricity supplied to homes from the electric company is "AC", and it alternates at a rate of sixty times per second or 60 Hz. In vehicles, the alternator supplies AC or alternating current which is converted or rectified to DC or direct current that is supplied by the battery for use in most of the electrical circuits in the vehicle.

A very important physical law governing electricity is called Ohm's Law. This law states that voltage, current, and resistance are all related to each other. According to Ohm's Law, one volt in a circuit with a resistance of one ohm will cause a current flow of one ampere.

Figure 3:
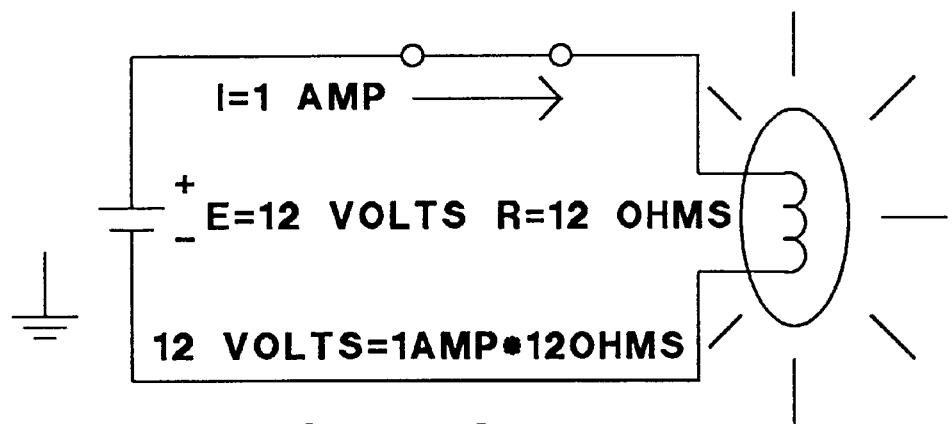
FIG. 3 is a schematic of a basic electrical circuit.

Referring to FIG. 3, voltage, current, and resistance in most electrical circuits can be calculated by using Ohm's Law, which states that "the voltage in a circuit is equal to the current multiplied by the resistance". If any two values in the formula are known, the third can be determined.

Ohm's Law states:

Amperes=Volts/Ohms

Ohms=Volts/Amperes

Volts=Amperes×Ohms

Figure 4:
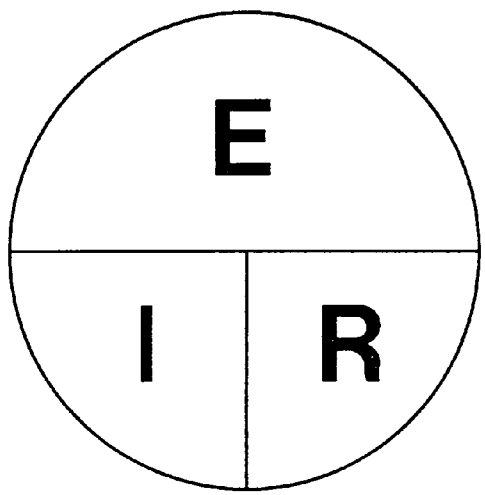
FIG. 4 is a picture of an ohm's law circle.

According to Ohm's Law, if the resistance in a circuit stays constant, a change in voltage will cause a similar change in current. If the voltage stays constant, a change in resistance will cause an opposite change in current. Ohm's Law explains the relationship between voltage, current, and resistance. Referring to FIG. 4 to quickly solve for the unknown value, put a finger over the value desired, then multiply the remaining values if they are side-by-side or divide them if one is over the other.

In vehicles there are three types of automotive circuits that exist. The circuits are series, parallel, and series-parallel circuits.

Figure 5:
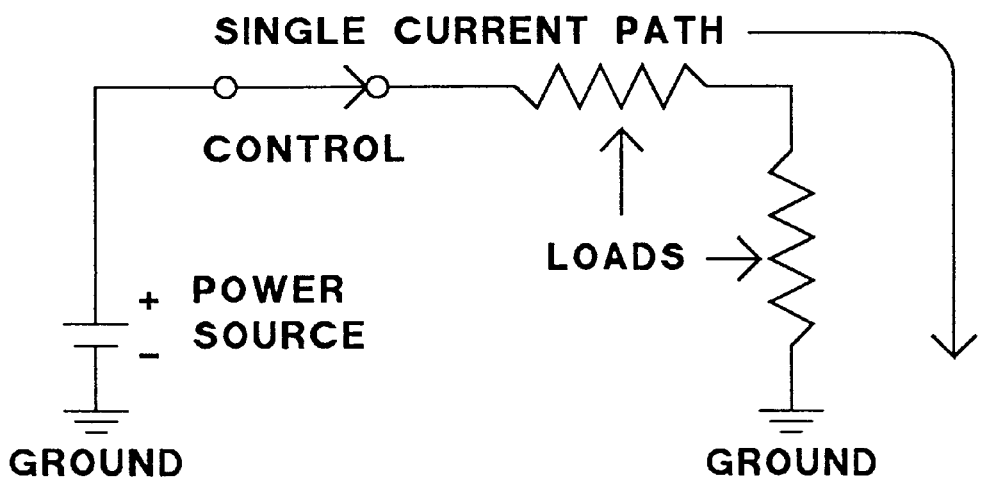
FIG. 5 is a schematic of a series electrical circuit.

Referring to FIG. 5, in a series circuit there is a power source, wiring to and from the power source, one or more loads with a single current path, and an optional control. The current flowing in a series circuit is the same at any point in the circuit.

Figure 6:
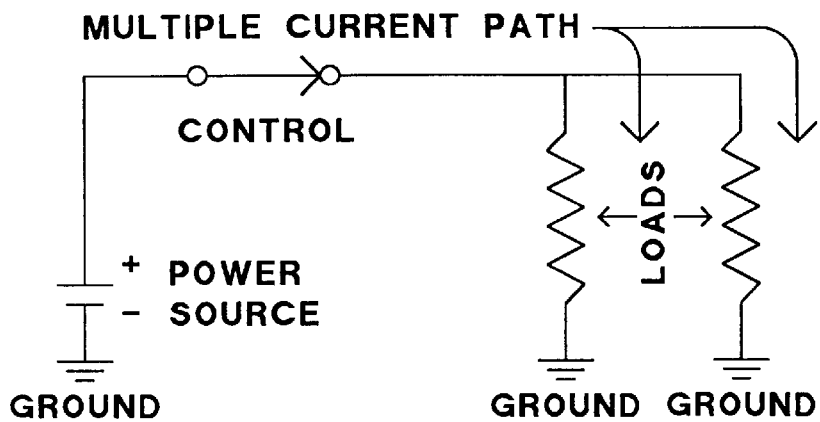
FIG. 6 is a schematic of a parallel electrical circuit.

Referring to FIG. 6, in a parallel circuit there is a power source, wiring to and from the power source, more than one load (connected to produce multiple current paths), and an optional control. The current flowing in a parallel circuit divides among the separate branches. The total circuit current is equal to the sum of the individual branches. The current through each branch is determined by the load resistance in that branch.

Figure 7:
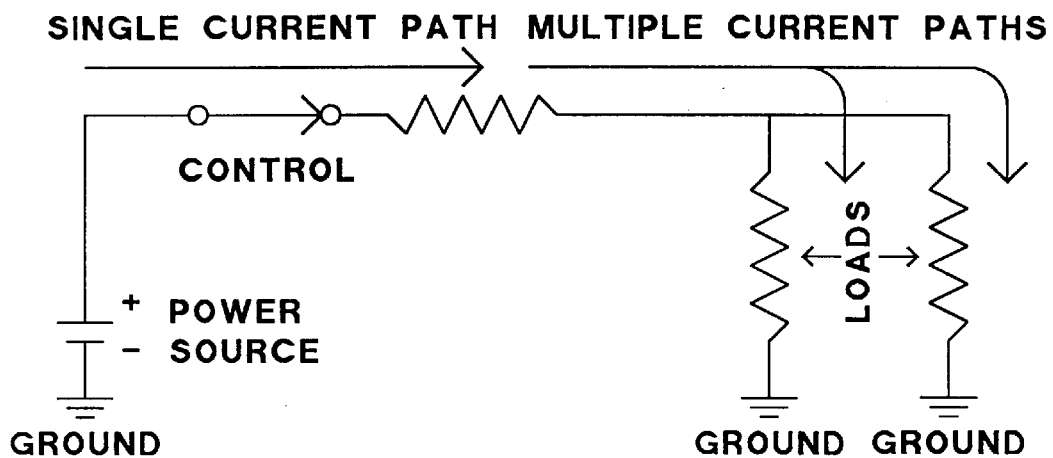
FIG. 7 is a schematic of a series-parallel electrical circuit.

Referring to FIG. 7, in a series-parallel circuit there is a power source, wiring to and from the power source, more than two loads connected (in series and parallel) to produce multiple current paths, and an optional control. A series-parallel circuit can be a series circuit wired with two or more loads in parallel. It can also be a parallel circuit with the loads of one or more branches wired in series.

There are two very common types of problems or faults that can exist in a circuit. They are known as an "open circuit," commonly called an "open" and a "short circuit" commonly called a "short." A short circuit can exist between components, or directly to ground, causing a "grounded circuit." An open circuit has a complete break in the current path at some point causing one or more circuit loads or devices not to work. Since electricity always takes the path of least resistance, a short across a load will bypass that load either through a lower resistance or directly to ground. This causes the shorted load and other components in the same circuit to malfunction or not work at all.

Digital multimeters (DMMs), scan tools, and scopes each have unique capabilities, and today's vehicles demand that technicians are able to use all three tools to correctly diagnose many of the problems that exist. Oscilloscopes alone cannot replace voltmeters or scan tools. By the same token, voltmeters or scan tools cannot replace oscilloscopes. Take for instance, a wheel speed sensor where a customer with anti-lock brakes complains that the brakes on his car are sometimes erratic. The technician may road test his vehicle and confirm the problem. During the road test the technician may notice that the ABS light does not come on. When the technician gets back to the shop, he plugs in the scan tool and finds no trouble codes. Using the voltmeter, the technician, following the manufacturer's instructions, looks at the output voltage from each of the wheel speed sensors. They all appear to be in tolerance, and the manufacturer's fault tree informs the technician that the next step is to replace the ABS computer. Unfortunately, the ABS computer on this vehicle is embedded in the master cylinder, so the technician must replace everything. The worst part is after the technician completes all of the work the problem still exists.

Figure 8:
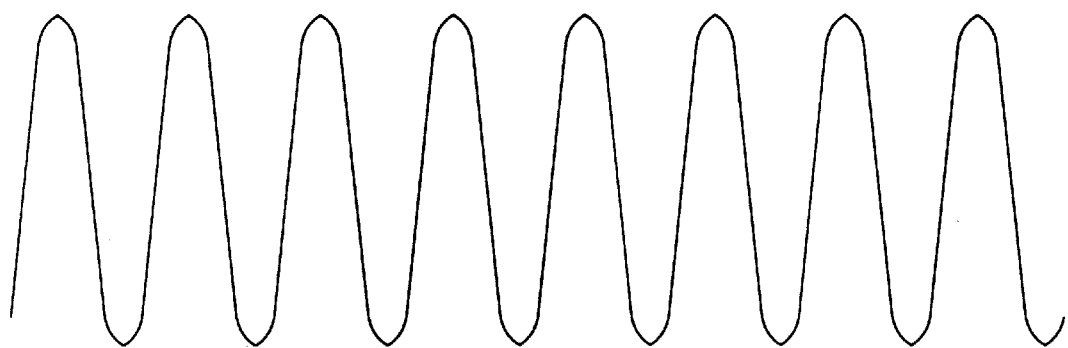
FIG. 8 is a waveform illustrating a normal ABS signal.

Most of the ABS signal shown in FIG. 8 is visible to voltmeters, scan tools, and scopes. However, the ABS faults shown in FIG. 9 are not visible to voltmeters and scan tools. They are only visible to scopes. If the technician had a scope, he could look at the output signal from each of the wheel speed sensors. From this the technician would have discovered that the right rear wheel speed sensor had some very fast aberrations that caused the ABS computer to act strange. The technician replaces the right rear wheel speed sensor to cure the problem. The scan tool missed this problem because no trouble codes were set and the computer communications bus was too slow to pick up the spikes. The voltmeter missed this problem because it averaged the sensor signals and could not see the fast aberrations.

Scan tools and DMMs sample very slow in comparison to scopes. Scan tools are limited to sampling less than 100 times per second and many only sample at 10 times per second. The fastest handheld digital multimeters typically only sample at 1,000 times per second while oscilloscopes sample at more than 1,000,000 times per second. This means that oscilloscopes are typically more than 100,000 times faster than scan tools and more than 1,000 times faster than DMMs. Oscilloscopes, like DDMs, are not limited by the vehicle type or manufacturer.

There are many examples of vehicle signals that voltmeters and scan tools are unable to detect. There are many vehicle problems that can occur that require a scope to diagnose accurately. Trying to solve these problems with just voltmeters and scan tools is like trying to diagnose a problem wearing a blindfold.

Voltmeters average many samples together to display a composite value of the signal, and on AC signals they typically display what is referred to as the RMS (Root Mean Square) value of the signal. A brief definition of RMS for a sine wave is the peak voltage of the sine wave multiplied by 0.707, which gives the equivalent DC voltage value that would be required to produce the same power through a fixed resistor.

Scan tools rely on what the vehicle computer detects, or what the manufacturer wants the vehicle computer to detect. Notably, scan tools sample very slow (much slower than a voltmeter). The vehicle computer uses a slow communication bus to talk to the scan tool which further reduces its ability to detect glitches or transient events. Yet, a scope can typically sample signals at more than 1,000,000 times per second, or 1,000 times faster than a fast voltmeter. A scope can display the actual waveform being produced by a sensor or sent by a device.

Referring to FIG. 10, a simple example of the electrical signal that the power company provides to a home shows up on a voltmeter as a number. The voltmeter takes the peak value of 165 volts and multiplies it by 0.707 to display 117 volts.

Referring to FIG. 11, the scope displays more information than the voltmeter (notice the spikes). Further, the scope works with past, present, and future vehicle electronics. As an example, a typical signal from a fuel injector on a 1980 Volkswagen looks very similar to a 1990 Oldsmobile or a 1993 Cummings diesel.

There are typically five types of signals in vehicles, namely:

(1) "Fast repetitive signals," such as the signal output by a digital mass air flow sensor;

(2) "Slow repetitive signals," such as the control signal for a fuel injector;

(3) "AC signals riding on top of a DC voltage," such as the output of a vehicle speed sensor;

(4) "Slow changing voltage," such as the output voltage from an analog throttle position sensor; and (5) "Single shot or transient signal," such as those found on a park/neutral switch.

Once the technician becomes familiar with the basic vehicle waveforms it does not matter how new or old the vehicle is, or even who manufactured the vehicle. The technician will be able to recognize signals that do not appear correct.

Waveforms are graphical representations of a voltage or current level moving up and down on a vertical (or Y) axis and displayed over time, from left to right, on a horizontal (or X) axis. Waveforms allow the technician to observe exactly the voltage or current levels at any particular moment in time.

A straight diagonal line pointing up from left to right would indicate an increasing voltage or current, where as a straight diagonal line pointing down from left to right would indicate a decreasing voltage or current. This type of signal would appear if the scope leads were placed across the terminals of an analog throttle position sensor. As the throttle is opened the voltage increases, and as the throttle is closed the voltage decreases.

A sharp angle up or down indicates a sudden change in the current or voltage. This is expected if the scope leads are placed across the primary ignition terminals going into a coil. As the coil voltage is cycled on and off the sharp edges indicate sudden changes in the current and voltage.

Waveforms represent a voltage or current level, which is referred to as its amplitude which moves up and down on a vertical axis and displayed over time, from left to right, on a horizontal axis. If a waveform is repetitive, like a sine wave, its frequency and period can be determined. The frequency, which is measured in Hertz (Hz) or cycles per second (CPS), refers to the number of times a signal repeats itself in one second. The period is measured in time and refers to the amount of time it takes for a waveform to complete one cycle. As an example, in the United States, the power company supplies power to homes that has a frequency of 60 Hz. This means that the waveform repeats itself sixty times per second. The period of this waveform is 1/60 of a second or 16.7 milliseconds or 0.0167 seconds. This is the amount of time it takes to complete one cycle.

The most common types of waveforms likely to be encountered in today's vehicles are illustrated below. Such waveforms include constant voltage waveforms, slow changing waveforms, square waveforms, pulse width modulated waveforms, step waveforms, and sine waveforms. Waveforms that are produced by the various sensors and continuously monitored by the vehicle's on-board computer must stay within certain boundaries or have certain characteristics that it will recognize to allow the automobile to function as designed. Waveforms that to outside these boundaries can confuse the vehicle's computer and cause driveability problems or basic malfunction of certain systems.

Figure 12:
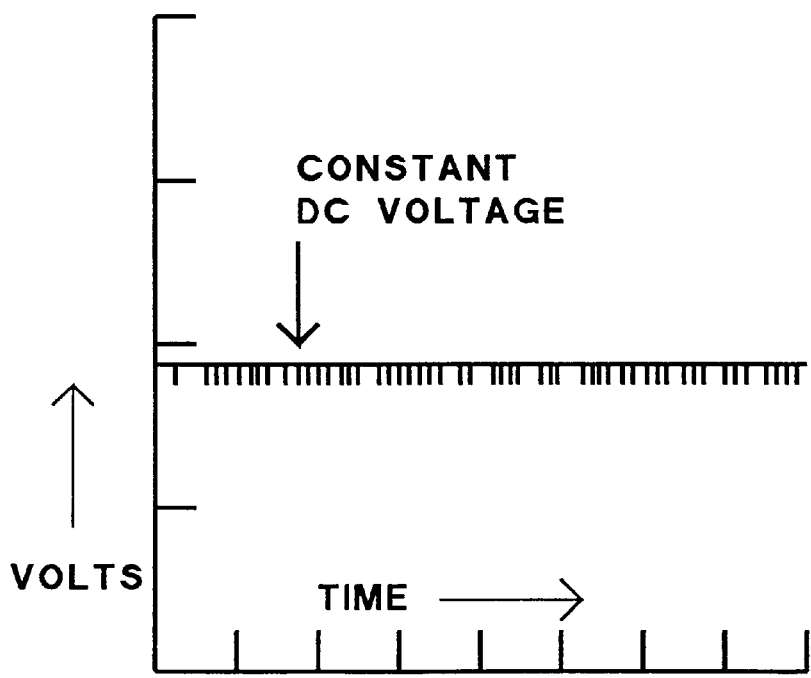
FIG. 12 is a battery voltage waveform displayed on the measuring device of FIG. 1 illustrating a constant DC voltage.

The scope is preferably a digital storage oscilloscope (DSO). Referring to FIG. 12, DSOs show a constant DC voltage as a flat horizontal line displayed across the screen. The amplitude of the DC voltage can be measured with the scope by selecting GND (ground) coupling, setting the displayed trace to one of the lower horizontal graticule lines, and then selecting DC coupling. At a vertical volts/division setting of 5 volts per division, a 12-volt DC signal will move approximately 2½ divisions up above the selected GND reference line on the screen. Most constant DC voltage waveforms found in automobile systems are used as the main power supply to electronic control modules and sensors. In order for these components to perform correctly they must have a supply voltage (typically 12–15 volts) and a good return path (ground). The scope can be used to monitor the DC supply voltage or ground connections while looking for any intermittent shorts or open circuits.

Slowly changing DC voltage waveforms are found in analog (continuous) output sensors and components. These sensors and components produce a slowly changing voltage in response to some stimulus (heat, air flow, throttle movement, exhaust oxygen content, engine vacuum, etc.). Manifold absolute pressure (MAP) sensors, throttle position sensors (TPS), oxygen ($O_2$) sensors, analog mass air flow (MAF) sensors (vane type and some hot wire), coolant temperature sensors (CTS) are all examples of sensors that output a slowly changing DC voltage.

Figure 13:
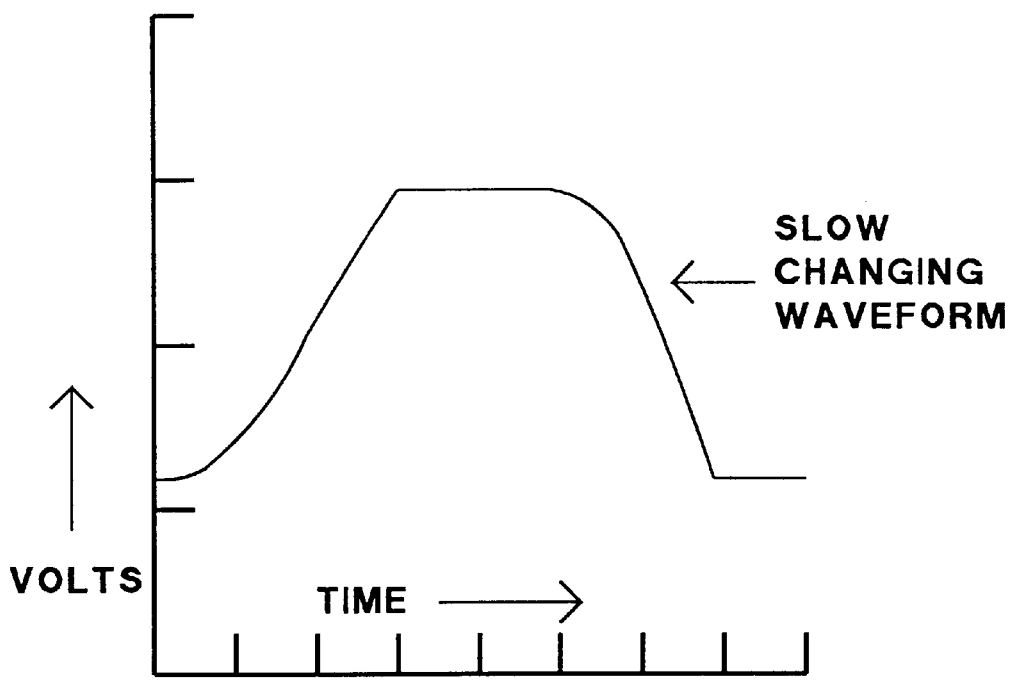
FIG. 13 is an analog throttle position sensor waveform displayed on the measuring device of FIG. 1 illustrating a slow changing waveform.

Referring to FIG. 13, the scope can be used at slower horizontal time base settings (0.1 seconds or slower) to view these slowly changing DC waveforms. When viewing slowly changing DC waveforms the most important characteristic is its vertical amplitude or voltage and whether the voltage changes within certain boundaries.

Square waveforms are produced by an electronic circuit that repeatedly turns a DC voltage on and off. The percentage of "on-time" and the "off-time" remains the same even as the frequency changes. Digital MAF sensors, Hall effect sensors, optical crankshaft sensors, position sensors, and ignition reference waveforms, are all examples of square waveforms. These sensors output square waveforms that typically increase in frequency as the engine RPM or load increases.

Figure 14:
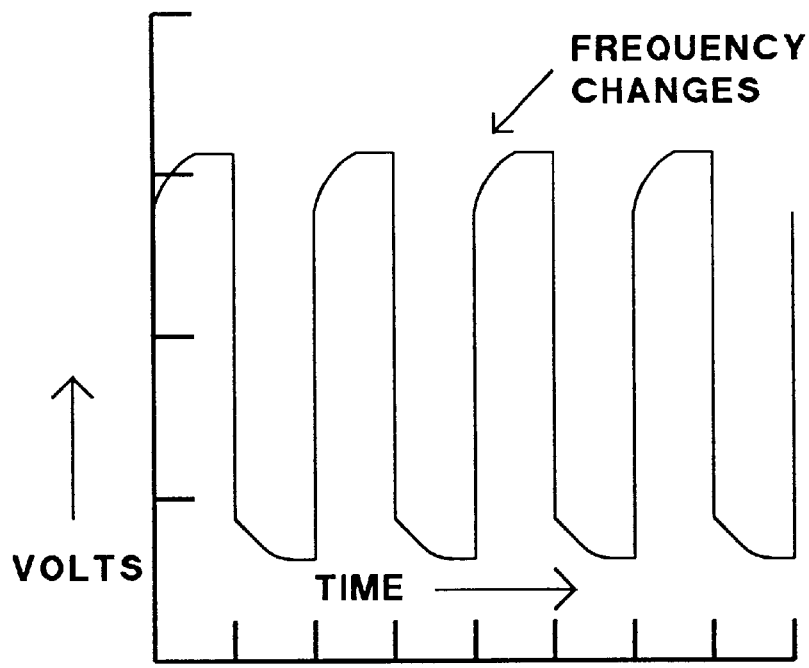
FIG. 14 is a digital mass air flow sensor output waveform displayed on the measuring device of FIG. 1 illustrating a waveform with a frequency.
Figure 15:
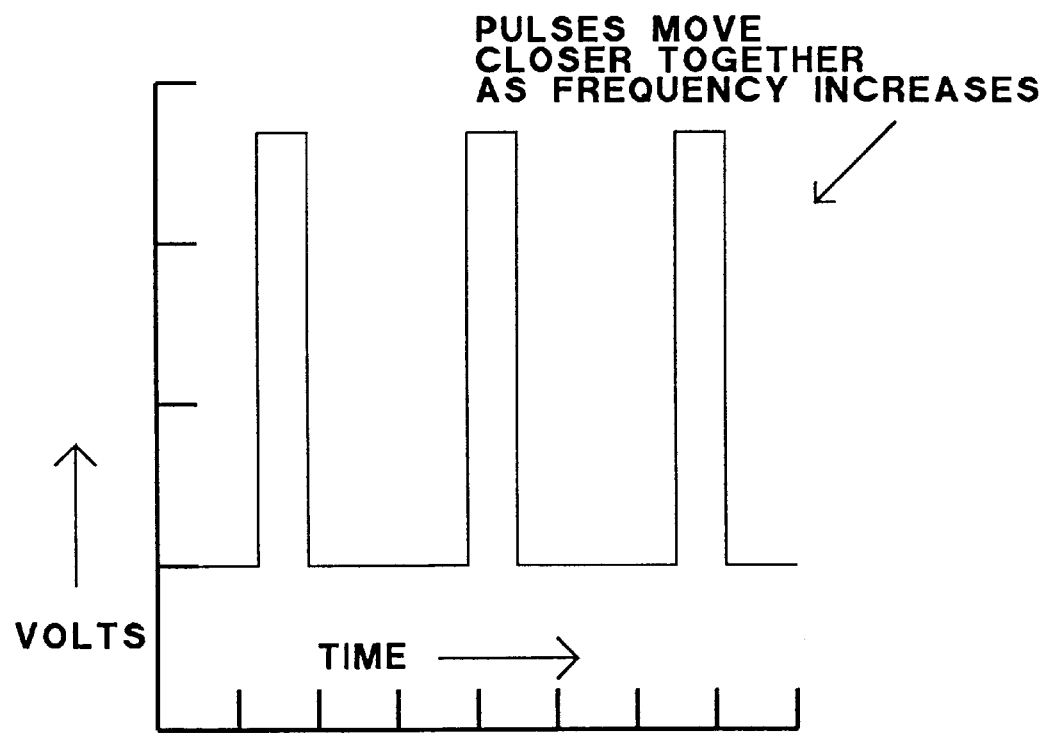
FIG. 15 is a idle speed control waveform displayed on the measuring device of FIG. 1 illustrating a PWM signal.

Referring to FIG. 14, some important characteristics of square waveforms are their on and off vertical voltage amplitude, how many on and off cycles occur per second (frequency in Hertz), and their shape (clean and symmetrical). Referring to FIG. 15, some square waves modulate their pulse widths and are called pulse width modulated (PWM) waveforms. These waveforms have changing (modulated) pulse widths.

Examples of PWM square waveforms can be found in mixture control solenoids, canister purge solenoids, idle air control solenoids, fuel injector waveforms, electronic spark timing (EST) waveforms, blower motor speed control waveforms, transmission shift control solenoids, ignition coil primary waveforms, and even some electric fuel pump control waveforms. Some important characteristics of a PWM waveform are its vertical voltage amplitude, on-time and off-time (duty cycle), shape, and whether the duty cycle changes as required by changing engine loads or speed. PWM waveforms have on and off times that change frequently to regulate the average amount of voltage for a device.

Figure 16:
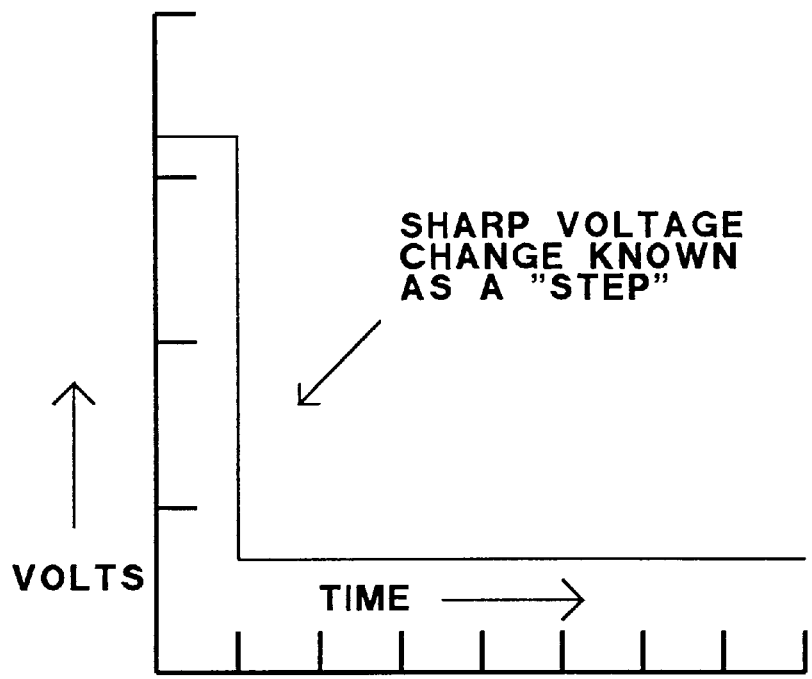
FIG. 16 is a park/neutral switch waveform displayed on the measuring device of FIG. 1 illustrating a step waveform.

Referring to FIG. 16, step voltage waveforms are produced by the park/neutral switch as the selector is changed from park to drive or reverse.

Sine waves are AC voltage waveforms that have voltage levels above and below a DC voltage reference level. When displaying sine waves, first set the DC GND reference line to the center horizontal graticule line. Then set the AC input coupling to block out the DC voltage and view the signal above and below the reference line. Some important characteristics of sine waves are their peak-to-peak voltage amplitude, the time duration of the signal (period or frequency), and the appearance or shape of the waveform. The scope voltage cursors are especially useful when measuring a peak-to-peak voltage amplitude. Place one voltage cursor on the top of the waveform and the other at the bottom of the waveform, then the readout in the upper right corner of the display will show the peak-to-peak voltage.

Figure 17:
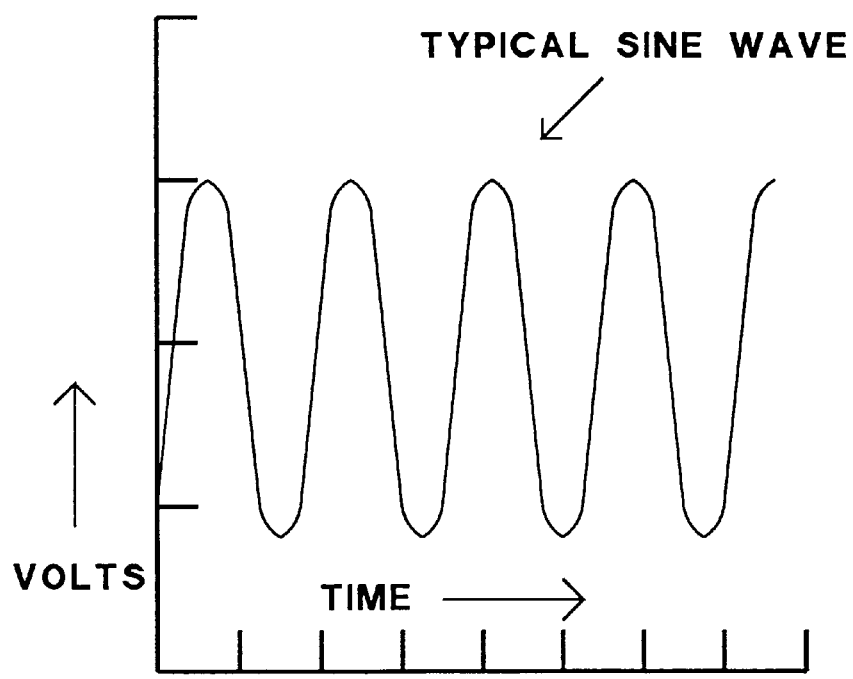
FIG. 17 is an ABS sensor output waveform displayed on the measuring device of FIG. 1 illustrating a sine wave.

Referring to FIG. 17, sine waves are produced by antilock brake system (ABS) magnetic wheel speed sensors, magnetic vehicle speed sensors, and by the charging system alternator.

The oscilloscope is basically a graph-displaying device that draws a graph of an electrical signal. In most applications the graph shows how signals change over time with the vertical axis representing voltage and the horizontal axis representing time. The graph shows many things about a signal, such as:

the time and voltage values of a signal;

the frequency of an oscillating signal;

the "moving parts" of a circuit represented by the signal;

if a malfunctioning component is distorting the signal;

how much of a signal is direct current (DC) or alternating current (AC);

how much of the signal is noise and whether the noise is changing with time; and compare known "good" waveforms with "live" waveforms.

Oscilloscopes can be divided into two types, namely, analog and digital. Analog oscilloscopes directly display continuously variable signals, while digital oscilloscopes convert these signals to discrete binary data that digitally represent the signal being acquired. An example of an analog device is a conventional phonograph turntable which directly converts the record grooves into sound. On the other hand a compact disc player is a digital device that takes discrete binary data and converts it to sound.

An analog oscilloscope works by directly applying a voltage being measured to an electron beam moving across the oscilloscope screen. The voltage deflects the beam up and down proportionally, tracing the waveform on the screen. In contrast, a digital oscilloscope samples the waveform and uses an analog-to-digital converter (A/D) to convert the voltage being measured into digital information. It then uses this digital information to reconstruct the waveform on the screen. Each type of oscilloscope does possess some unique characteristics making it more or less suitable for specific tasks. For instance, analog oscilloscopes can display rapidly varying signals in "real time" (or as they occur). However, they usually cannot capture and store signals for analysis and comparison like digital oscilloscopes. Digital oscilloscopes even allow the capture and viewing of events that may happen only once. Also, they can process the digital waveform data and display it or send the data to a computer for processing. Since digital oscilloscopes can store the digital waveform data in memory or on a computer, this allows viewing and printing at a later time, next week, or even next year. Analog oscilloscopes work somewhat differently than digital oscilloscopes. However, several of the internal systems are similar. Analog oscilloscopes are somewhat simpler in concept.

When connecting an oscilloscope probe to a circuit, the voltage signal travels through the probe to the vertical system of the oscilloscope. Depending on how the vertical scale (volts/div control) is set, an attenuator reduces the signal voltage or an amplifier increases the signal voltage. On analog scopes, the signal travels directly to the vertical deflection plates of the cathode ray tube (CRT). Voltage applied to these deflection plates causes a glowing dot to move. (An electron beam hitting phosphor inside the CRT creates the glowing dot.) A positive voltage causes the dot to move up while a negative voltage causes the dot to move down. The signal also travels to the trigger system to start or trigger a "horizontal sweep." Horizontal sweep is a term referring to the action of the horizontal system causing the glowing dot to move across the screen. Triggering the horizontal system causes the horizontal time base to move the glowing dot across the screen from left to right within a specific time interval. Many sweeps in rapid sequence cause the movement of the glowing dot to blend into a solid line. At higher speeds, the dot may sweep cross the screen at any suitable speed, such as, for example, 500,000 times each second. Together, the horizontal sweeping action and the vertical deflection action traces a graph of the signal on the screen. The trigger level 30 is necessary to stabilize a repeating signal and ensure that the sweep begins at the same point of a repeating signal, resulting in a clear picture.

In order to use an analog or digital oscilloscope, three basic settings are used to accommodate an incoming signal, namely, (1) the attenuation or amplification of the signal uses the volts/div button 24 to adjust the amplitude of the signal before it is displayed on the screen 12;

(2) the time base uses the sec/div button 28 to set the amount of time per division represented horizontally across the screen 12; and (3) the triggering of the oscilloscope uses the trigger level button 30 to stabilize a repeating signal, as well as triggering on a single event. Also, adjusting the focus and intensity controls helps create a sharp visible display on analog scopes.

Digital oscilloscopes contain additional data processing and acquisition systems not available on analog scopes. The digital oscilloscope first collects data for the entire waveform and then displays it. When a probe is connected to a circuit, the vertical system of the digital scope adjusts the amplitude of the signal just as in the analog oscilloscope. Next, the analog-to-digital converter (A/D) in the acquisition system samples the signal at discrete points in time and converts the signal's voltage at these points to digital values called "sample points." The horizontal system's sample clock determines how often the A/D takes a sample. The rate at which the clock "ticks" is called the "sample rate" and is measured in "samples per second." Then the sample points from the A/D are stored in memory as waveform points. Together, the sampled points make up one waveform record. The number of waveform points used to make a waveform record is called the "record length." The digital scope preferably samples at a rate of up to 12 million samples per second. In most cases, more than one sampled point will make up one displayed waveform point. The scope stores several sampled points, for each displayed point. The trigger system determines the starting point of the record. The display 14 receives these record points after being stored in memory. As a reminder, on both digital and analog oscilloscopes, the vertical, horizontal, and trigger settings must be set to properly display a waveform.

The engine compartment of a running vehicle is a very unfriendly environment for automotive signals. Temperature extremes, dirt and corrosion, and electrical leaks or "noise" from the high voltage pulses from a typical ignition system can produce interference that can contribute significantly to the cause of many driveability complaints. When probing components, sensors, and circuits, the electrical "noise" from today's high output ignition systems can produce an RF (radio frequency) energy that is similar to a radio station. Since oscilloscopes are so sensitive, this interference can actually override the signals one is trying to capture and give a false reading on the display.

Most interference is actually picked up by the oscilloscope test leads, which can be minimized by the following.

(a) Routing the test leads away from all ignition wires and components whenever possible.

(b) With the potential for RF interference in the engine compartment, if possible use the vehicle chassis as ground when connecting the oscilloscope test leads. In some cases the engine block can actually act as an antenna for the RF signals.

(c) Use the shortest test leads possible since other test leads may act as an antenna and increase the potential for interference, especially at higher frequency levels that are found when probing near the vehicle's on-board computer.

Like the test leads, the oscilloscope can also pick up interference by the following.

(a) Because the circuits of an oscilloscope are sensitive do not place the oscilloscope directly on ignition wires or near high energy ignition components like coil packs.

(b) When using an AC or DC charger/adapter to power the scope, keep the external power leads as far away from the engine and ignition as possible.

Below is a description of some of the most common measurement terms.

If a signal repeats, it has a frequency. The frequency is measured in Hertz (Hz) and equals the number of times the signal repeats itself in one second (the cycles per second). A repeating signal also has a period which is the amount of time it takes the signal to complete one cycle. Frequency and period are reciprocals of each other so that 1/period equals the frequency and 1/frequency equals the period. So, for example, if a certain sine wave has a frequency of 3 Hz, it will have a period of ⅓ second. Voltage is the amount of electric potential (a kind of signal strength) between two points in a circuit. Usually one of these points is ground (zero volts) but not always. The voltage from the maximum peak to the minimum peak of a waveform is referred to as its peak-to-peak voltage. The word amplitude commonly refers to the maximum voltage of a signal measured from ground to zero volts.

Figure 18:
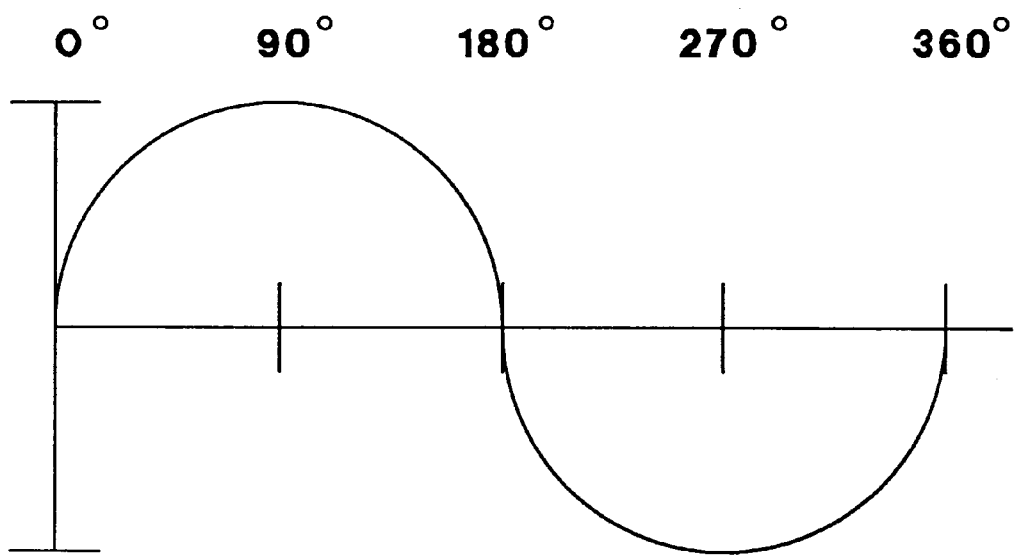
FIG. 18 is a sine waveform illustrating the different degrees.

Referring to FIG. 18, phase is best explained by looking at a sine wave. Sine waves are based on circular motion, and a circle has 360°, so therefore one cycle of a sine wave has 360°. Using degrees, the phase angle of a sine wave is described as how much of the period has elapsed.

Figure 19:
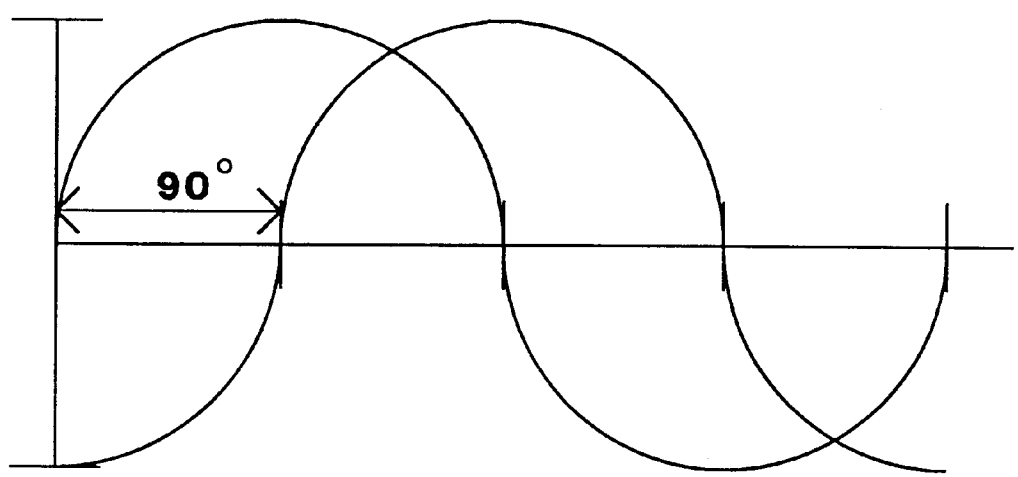
FIG. 19 is a voltage waveform and current waveform illustrating a phase shift.

Referring to FIG. 19, phase shift describes the difference in timing between two otherwise similar signals. For example, using a sine wave from a standard AC outlet, the "current" waveform is said to be 90° out of phase with the "voltage" waveform since the sine waves reach similar points in their cycles exactly ¼ of a cycle apart (360°/4= 90°). The voltage and current waveforms are said to have a 90° phase shift.

Aliasing occurs when a digital oscilloscope does not sample a particular signal fast enough. Since the oscilloscope did not acquire samples fast enough, when it reconstructs and displays the waveform it can be "fooled" into displaying a false or "aliased" waveform. To prevent aliasing, the scope uses a sampling rate many times faster than the fastest anticipated automotive signal.

The scope 10 is a handheld digital oscilloscope designed for use in the automotive service industry. The scope provides advanced troubleshooting capabilities for automotive service technicians in an easy to operate format.

A rotary switch 14 allows a technician to cycle through the internal memory which contains known good automotive waveforms and settings. This way a technician can quickly and easily look at a known good pattern in the internal memory and have the scope set itself up for the measurement. Easy to use cursors are available for making more precise voltage and timing measurements.

Power is supplied to the scope via an internal battery as well as an external adapter/charger. An RS-232 cable provides an interface to a computer for mass waveform storage and printout capability. All features are accessed by push buttons and a front panel rotary switch 14. In most cases, changes are indicated on the screen or the rotary switch 14.

To assist the operator there is a standard setup that is displayed when switched to the Lab Scope mode 15$q$. In the Lab Scope mode 15$q$, the scope always defaults to the input channel positioned to the center of the screen with DC coupling, auto-trigger with a trigger level of 1.5 volts, vertical set to 5 volts/division, horizontal set to 5 milliseconds/division, and cursors turned off.

There is one input channel with a common or ground that is used for signal input. Signal conditioning consists of an attenuator that uses a specialized design that limits the number of mechanical relays to one dual relay to minimize cost.

The oscilloscope is controlled by a single microprocessor. The microprocessor handles all of the internal housekeeping and display functions. The analog inputs are digitized and directed by a gate array which handles all signal processing and manipulation.

The display 12 incorporates its own internal display drivers and an electroluminescent backlight operated by button 36. The operating system resides internally in read only memory (ROM). On power-up, the microprocessor performs a self-test to insure proper scope operation.

The following four simple steps allow the use of the scope 10.

(1) Press the ON/OFF button 20 to turn on the scope 10.
(2) Connect the test leads to the scope inputs 16 and 18 and the sensor under test.
(3) Turn the rotary switch 14 to the sensor under test.
(4) Press the stored/live WFM button 32 to toggle between the stored reference waveform and the live waveform.

If the display appears faint, blank, or dark, adjust the contrast knob (not shown) located on the left side of the scope for a proper display.

Figure 20:
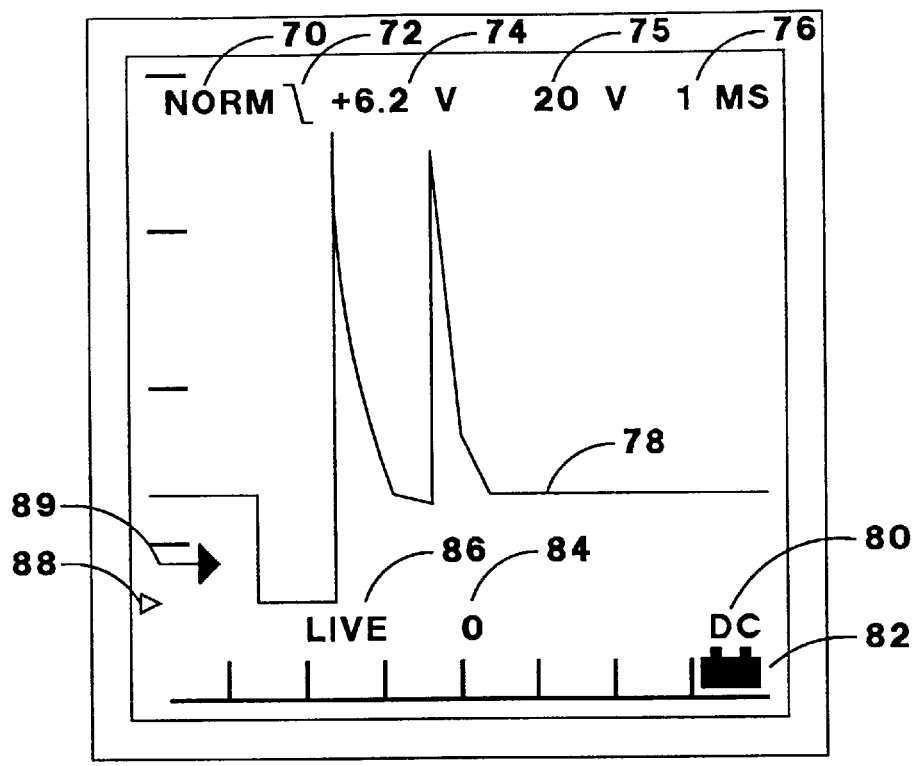
FIG. 20 is a display layout of the measuring device of FIG. 1.

Referring to FIG. 20, the display 12 displays the following information:

(a) Trigger mode 70;
(b) Trigger slope 72;
(c) Trigger level 74;
(d) Volts per division 75;
(e) Time per division 76;
(f) waveform 78;
(g) Coupling 80;
(h) Battery level indicator 82;
(i) Scroll position indicator (−4 to +4) 84;
(j) Stored or live waveform indicator 86;
(k) Ground level indicator 88; and
(l) Trigger level indicator 89.

The cursor button 33 cycles through the following five functions.

(1) The first press of the cursor button 33 turns on the time cursors and allows the scroll button 35 to move one of the time cursors left or right.
(2) The second press of the cursor button 33 allows the scroll button 35 to move the other time cursor left or right.
(3) The third press of the cursor button 33 turns off the time cursors and turns on the voltage cursors, allowing the scroll button 35 to move one of the voltage cursors up or down.
(4) The fourth press of the cursor button 33 allows the scroll button 35 to move the other voltage cursor up or down.
(5) The fifth press of the cursor button 33 turns off the voltage cursors.

Figure 21:
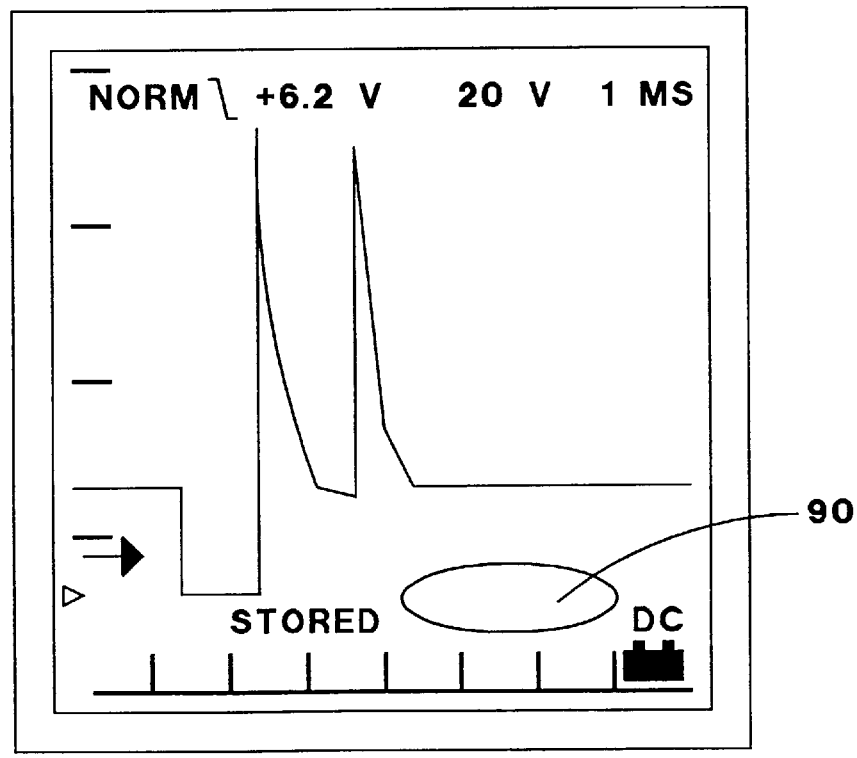
FIG. 21 is a display layout of the measuring device of FIG. 1 illustrating the use of a cursor button.

Referring to FIG. 21, when the cursor button 33 activates the voltage or time cursors, either the voltage or time difference between the cursors is shown in area 90 of the display 12.

Figure 22:
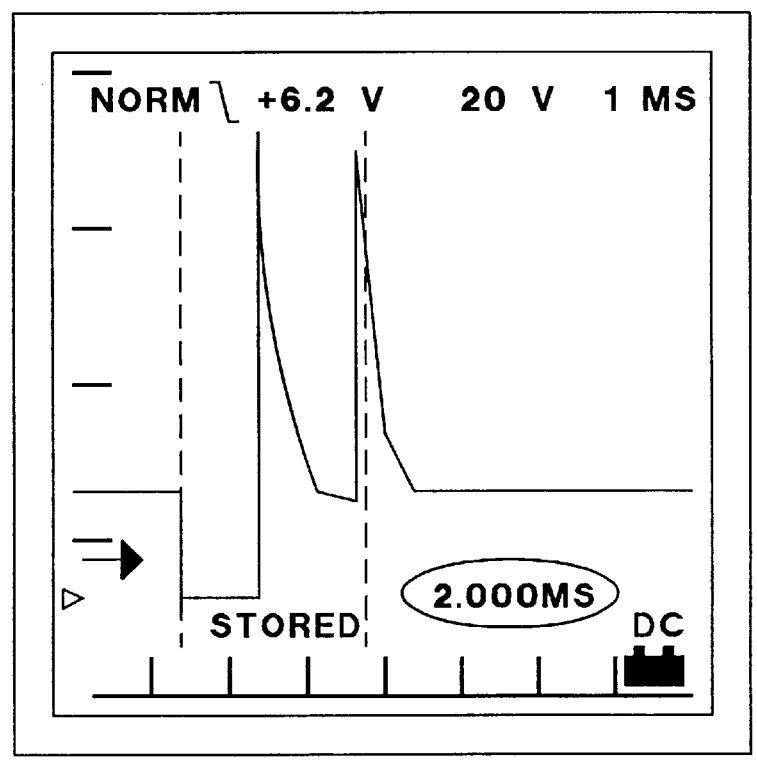
FIG. 22 is a display layout of the measuring device of FIG. 1 illustrating the use of time cursors.

Referring to FIG. 22, to use the time cursors:
(a) the first press of the cursor button 33 turns on the time cursors and allows the scroll button 35 to move one of the time cursors left or right; and
(b) the second press of the cursor button 33 allows the scroll button 35 to move the other time cursor left or right.

Figure 23:
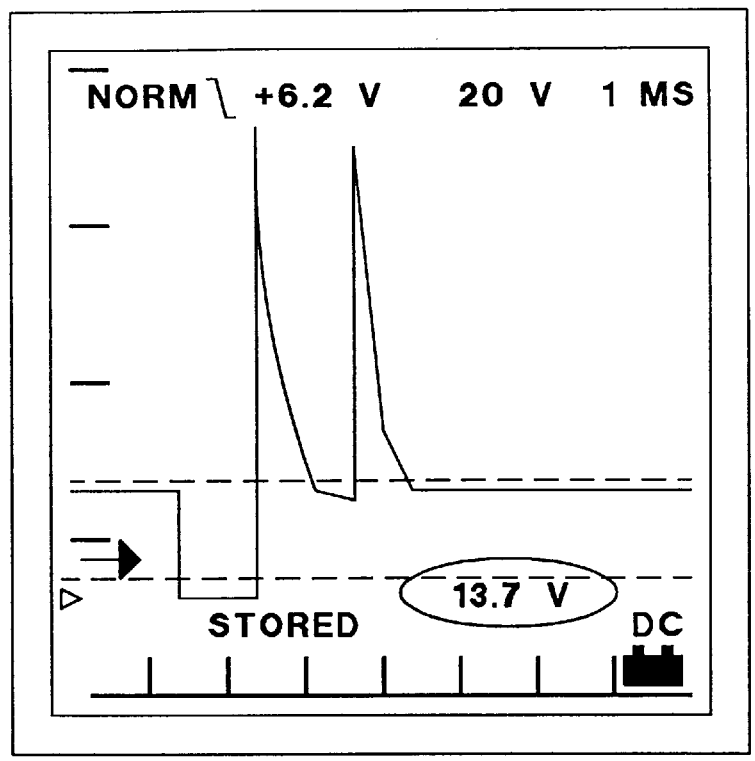
FIG. 23 is a display layout of the measuring device of FIG. 1 illustrating the use of voltage cursors.

Referring to FIG. 23, to use the voltage cursors:
(a) the third press of the cursor button 33 turns off the time cursors and turns on the voltage cursors, allowing the scroll button 35 to move one of the voltage cursors up or down;
(b) the fourth press of the cursor button 33 allows the scroll button 35 to move the other voltage cursor up or down; and
(c) the fifth press of the cursor button 33 turns off the voltage cursors.

Pressing the stored/live waveform button 32 toggles the displayed waveform between the stored reference waveform and the live waveform.

When viewing a live waveform in the NORM or SINGLE trigger mode when a trigger is not present, a "NO TRIG" appears in the display 12. The trigger mode may be changed to auto to cause this to disappear. If a number between −4 and +4 appears in the display after "LIVE," this indicates the freeze/run button 22 has been pressed and the live waveform is frozen. To release the waveform press the freeze/run button again and the number displayed after "LIVE" will disappear. At this point the normal scope acquisition mode is restored.

Pressing the trigger button 37 toggles between AUTO, NORM, and SNGL trigger mode. Auto trigger mode (AUTO) automatically triggers the scope internally and displays a signal. Normal trigger mode (NORM) only displays a signal when a trigger is present. Single trigger mode (SNGL) only displays the first triggered event.

The trigger mode cannot be changed when the scope is in the stored mode or when the freeze mode is active. Trigger mode can only be changed when the scope is in the live mode and the display is not frozen. When viewing a live waveform in the NORM or SINGLE trigger mode when a trigger is not present, a "NO TRIG" appears in the display. The trigger mode must be changed to AUTO or adjust the trigger level to be on the waveform, in order for the "NO TRIG" to disappear. If a number between −4 and +4 appears in the display after "LIVE," this indicates the freeze/run button 22 has been pressed and the live waveform is frozen. To release the waveform, press the freeze/run button 22 again, and the number displayed after "LIVE" will disappear. At this point the scope is back in the normal scope acquisition mode. Pressing the slope button 39 toggles the displayed trigger slope between positive and negative.

The trigger slope cannot be changed when the scope is in the stored mode or the freeze mode is active. Trigger slope can only be changed when the scope is in the live mode and the display is not frozen. When viewing a live waveform in the NORM or SINGLE trigger mode when a trigger is not present, a "NO TRIG" appears in the display. The trigger mode must be changed to AUTO or adjust the trigger level to be on the waveform in order for the "NO TRIG" to disappear. If a number between −4 and +4 appears in the display after "LIVE," this indicates that the freeze/run button 22 has been pressed and the live waveform is frozen. To release the waveform, press the freeze/run button 22 again and the number displayed after "LIVE" will disappear. At this point the scope is in the normal scope acquisition mode.

Pressing the AC/DC button 41 toggles the scope input coupling between AC, DC, and GND. AC coupling removes the DC component from the input signal. DC coupling allows the DC component of the input signal to be included on the oscilloscope display. GND grounds the input of the scope internally.

To save a waveform and front panel setup in memory locations 1 through 4 (15s, 15t, 15u, 15v) use the following three steps:

(1) press the freeze/run button 22 to hold the current waveform and front panel settings on the display;

(2) rotate the knob 14 to one of the memory locations, MEM1 15s through MEM4 15v; and (3) pressing the save button 43 saves the waveform and front panel settings in the selected location and "stored" will appear at the bottom of the display 12.

The waveforms and settings stored in memory locations 1–4 will remain until overwritten with new settings and waveforms.

The scroll button 35 is used with the freeze/run button 22 to display up to nine consecutive stored waveforms. When the freeze/run button 22 is pressed the scope continues to acquire waveforms to fill up the remaining scroll memory locations +1 to +4. One may also scroll backwards in memory to see waveforms that were acquired prior to pressing the freeze/run button 22 in scroll memory locations −1 to +4.

If a number between −4 and +4 appears in the display after "LIVE," this indicates the freeze/run button 22 has been pressed and the live waveform is frozen. To release the waveform press the freeze/run button 22 again and the number displayed after "LIVE" will disappear. At this point the scope is back in the normal scope acquisition mode. When using slower sweep speeds, the scroll memory will take a long time to fill the locations from +1 to +4. As an example, if the time per division is 1 second then it will take at least 8 seconds to fill up each memory location after the freeze/run button 22 is pressed.

The volts per division control 24 changes the volts represented by each division and adjusts the sensitivity up or down. Pressing the top of the volts/div button 24 decreases the volts per division displayed, while pressing the bottom of the volts/div button 24 increases the volts per division displayed.

The position control button 26 changes the vertical position of the live displayed waveform. The position control moves the displayed live waveform up or down. Pressing the top of the pos button 26 moves the displayed live waveform up, while pressing the bottom of the pos button 26 moves the displayed live waveform down.

The time per division button 28 changes the time represented by each division and adjusts the sensitivity up or down. Pressing the right side of the time/div button 28 decreases the time per division displayed, while pressing the left side of the time/div button 28 increases the time per division displayed.

The trigger level button 20 adjusts the trigger voltage level required to properly trigger the scope.

Pressing the top of the trigger level button 30 increases the trigger voltage level while pressing the bottom of the trigger level button 30 decreases the trigger voltage level.

How and where the sensors and signals are hooked up in the vehicle is important. Never should any wire insulation be pierced, insulation be stripped away, or weather pack seal be broken. The best way to view vehicle signals is to use a recommended or approved breakout box. The next best approach is to use an old wiring harness to make breakout leads. Once a good connection is made, it is important to check that all leads and cables are away from hot surfaces, belts, fans, moving parts, and secondary ignition wires. A poor signal or one that disappears could be bad due to a poor connection. When probing certain sensors, like an $O_2$ sensor, never short the output of the $O_2$ sensor or load it down.

Next, a number of common waveform shapes from various vehicle manufacturers with oscilloscope set-ups are shown. These waveforms represent typical signals from actual automotive outputs. Signals acquired from similar vehicles may appear slightly different. The waveform shapes and oscilloscope set-ups shown below provide a quick working knowledge of how to set up the scope for various automotive signal types.

All of the waveforms and front panel control settings are preprogrammed into the memory of the scope which makes the scope extremely easy to use for diagnosing the most common driveability problems.

Figure 24:
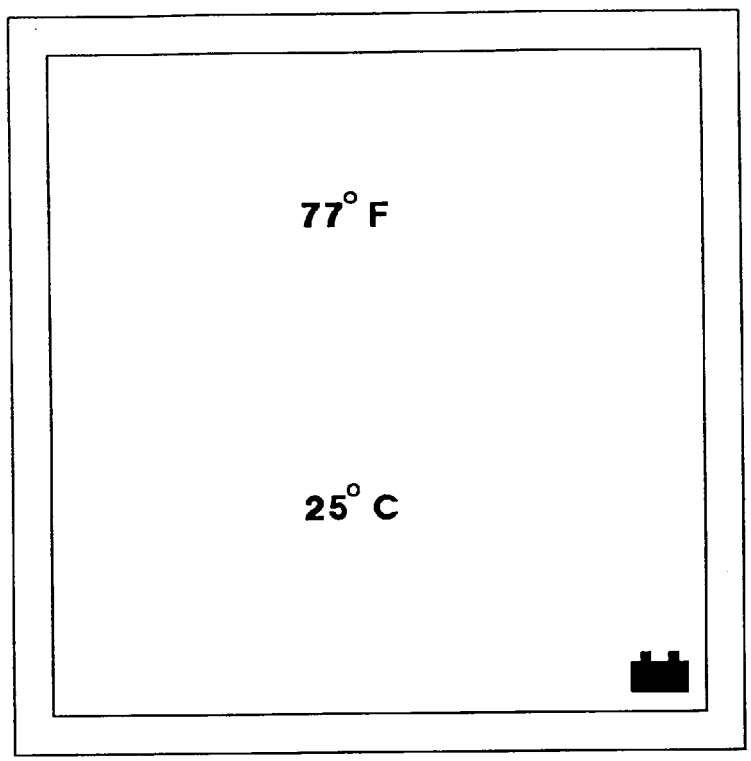
FIG. 24 is a display layout of the measuring device of FIG. 1 illustrating a temperature measurement.

Referring to FIG. 24, to test the temperature the following steps are performed.

1. Press the ON/OFF button 20 to turn on the scope.
2. Connect a thermocouple adapter to the INPUT 16 and the COM 18 on the scope. The adapter is sensitive to polarity so the (−) side is connected to the COM 18 and the (+) to the input.
3. Connect the K-type thermocouple to the thermocouple adapter. Note the adapter and thermocouple are both sensitive to polarity, so the (−) side of the adapter is connected to the (−) side of the thermocouple and the (+) side of the adapter is connected to the (+) side of the thermocouple.
4. Turn the rotary switch 14 to the TEMP 15d position.
5. The scope will continuously display the temperature in fahrenheit and celsius.

Figure 25:
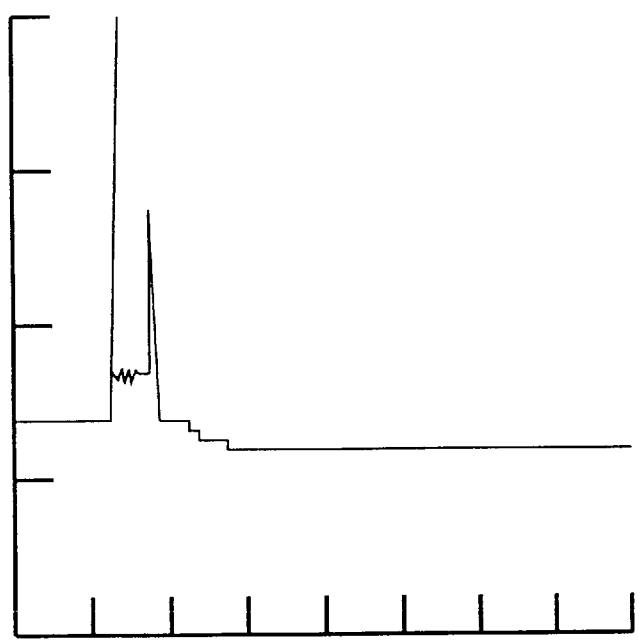
FIG. 25 is a display layout of the measuring device of FIG. 1 illustrating a distributorless ignition waveform.

Referring to FIG. 25, to test a Distributorless Ignition Output the following steps are performed.

1. Press the ON/OFF button 20 to turn on the scope.
2. Connect one lead of a capacitive probe to the INPUT 16 and the other lead to COM 18 on the scope.
3. Connect the COM 18 lead to a good ground on the engine.
4. Connect the lead around the output plug wire of any coil pack.
5. Turn the rotary switch 14 to the DI (Distributorless Ignition) position 15e.
6. With the engine running, press the stored/live button 32 to cycle between the stored reference waveform and the live waveform. If a live signal does not appear or the scope displays NO TRIG, then either reverse the leads on the COM 18 and INPUT 16 or move the lead to the other output from that same coil pack. The output of DI coil packs have a positive going signal on one output and a negative going signal on the other output. If a signal still does not appear, try adjusting the trigger level up or down.

Figure 26:
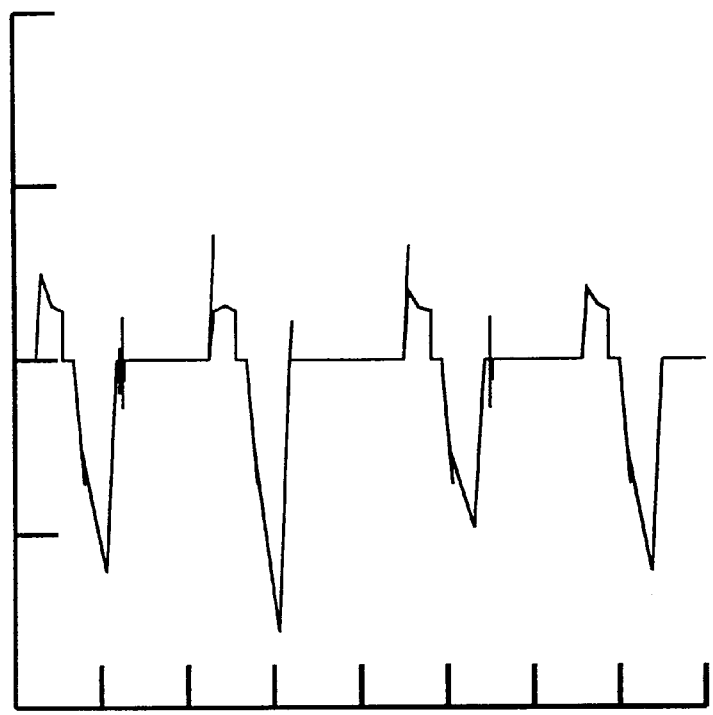
FIG. 26 is a display layout of the measuring device of FIG. 1 illustrating an electronic ignition waveform.

Referring to FIG. 26, to test an Electronic Ignition Output the following steps are performed.

1. Press the ON/OFF button 20 to turn on scope.
2. Connect one lead of the capacitive probe to the INPUT 16 and the other lead to the COM 18 on the scope.
3. Connect the COM 18 lead to a good ground on the engine.
4. Connect the INPUT 16 lead around the output of the coil before the distributor.
5. Turn the rotary switch 14 to the EI (Electronic Ignition) position 15i.
6. With the engine running, press the stored/live button 32 to cycle between the stored reference waveform and the live waveform. If a live signal does not appear or the scope displays NO TRIG, try adjusting the trigger level up or down until a waveform is displayed.

Figure 27:
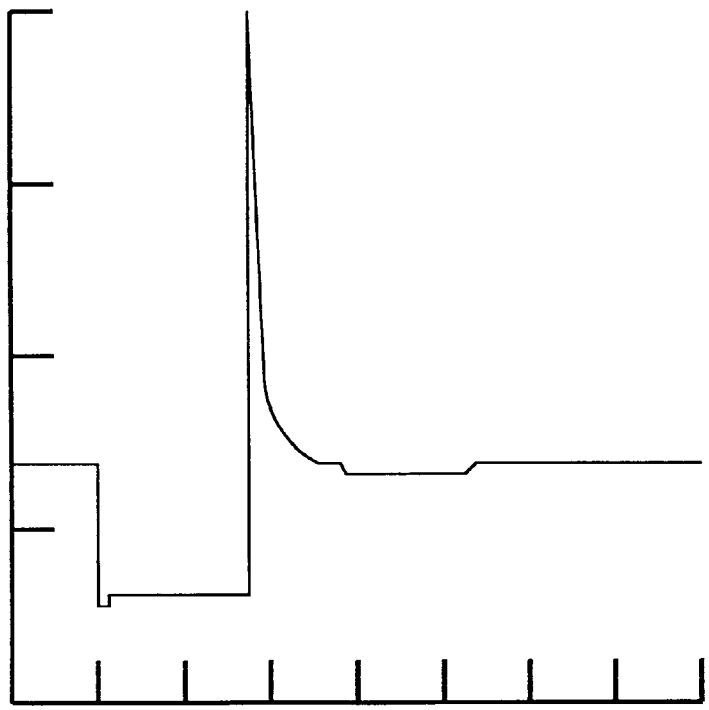
FIG. 27 is a display layout of the measuring device of FIG. 1 illustrating a multi-port injection waveform.

Referring to FIG. 27, to test a Multi-port Fuel Injector Output, the following steps are performed.

1. Press the ON/OFF button 20 to turn on the scope.
2. Connect one test lead to the INPUT 16 and the other test lead to the COM 18.
3. Connect the COM 18 test lead to a good ground on the engine near the injector.
4. Connect the INPUT 16 test lead to the output of the injector.
5. Turn the rotary switch 14 to the MFI (Multi-port Fuel Injection) position 15g.
6. With the engine running, press the stored/live button 32 to cycle between the stored reference waveform and the live waveform.

Figure 28:
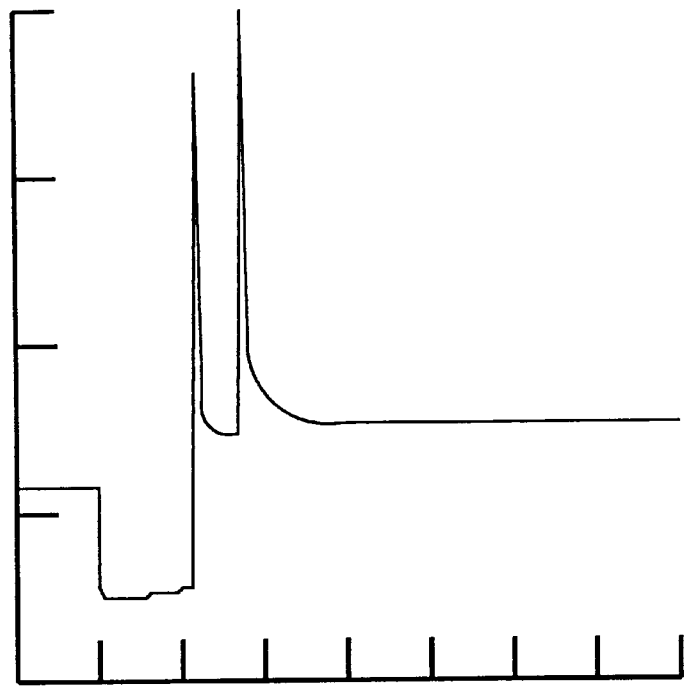
FIG. 28 is a display layout of the measuring device of FIG. 1 illustrating a throttle body injector waveform.

Referring to FIG. 28, to test a Throttle Body Fuel Injector Output, the following steps are performed.

1. Press the ON/OFF button 20 to turn on the scope.
2. Connect one test lead to the INPUT 16 and the other test lead to the COM 18.
3. Connect the COM 18 test lead to a good ground on the engine near the injector.
4. Connect the INPUT 16 test lead to the output of the injector.
5. Turn the rotary switch 14 to the TBI (Throttle Body Fuel Injection) position 15h.
6. With the engine running, press the stored/live button 32 to cycle between the stored reference waveform and the live waveform. If a live signal does not appear or the scope displays NO TRIG, try adjusting the trigger level up or down until a waveform is displayed. Also, make sure the test leads are making a good electrical connection.

Figure 29:
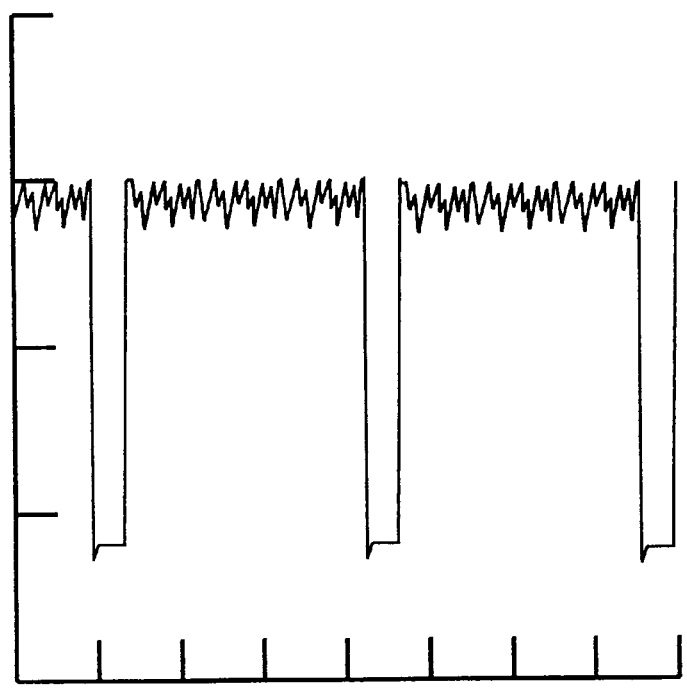
FIG. 29 is a display layout of the measuring device of FIG. 1 illustrating a camshaft position sensor waveform.

Referring to FIG. 29, to test a Camshaft Position Sensor Output, the following steps are performed.

1. Press the ON/OFF button 20 to turn on the scope.
2. Connect one test lead to the INPUT 16 and the other test lead to the COM 18.
3. Connect the COM 18 test lead to a good ground on the engine.
4. Connect the INPUT 16 test lead to the output of the camshaft position sensor.
5. Turn the rotary switch 14 to the CMP (Camshaft Position Sensor) position 15j.
6. With the engine running, press the stored/live button 32 to cycle between the stored reference waveform and the live waveform. If a live signal does not appear or the scope displays NO TRIG, try adjusting the trigger level up or down until a waveform is displayed. There are many different types of camshafts position sensors, operating at different output levels. Also try adjusting the time base to a faster setting of 5 mS or 10 mS per division or adjusting the voltage to a setting of 2 V or 5 V per division. Also, make sure the test leads are making a good electrical connection.

Figure 30:
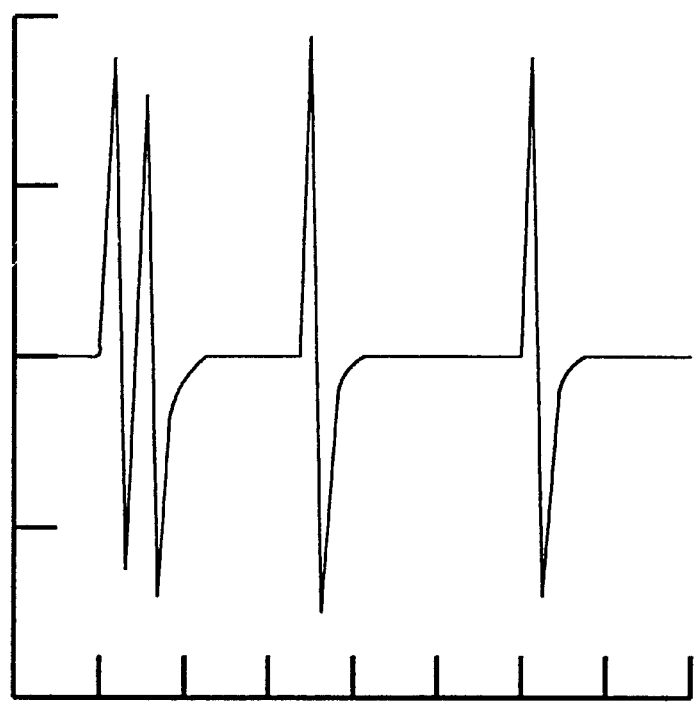
FIG. 30 is a display layout of the measuring device of FIG. 1 illustrating a crankshaft position sensor waveform.

Referring to FIG. 30, to test a Crankshaft Position Sensor Output the following steps are performed.

1. Press the ON/OFF button 20 to turn on the scope.
2. Connect one test lead to the INPUT 16 and the other test lead to the COM 18.
3. Connect the COM 18 test lead to a good ground on the engine.
4. Connect the INPUT 16 test lead to the output of the camshaft position sensor.
5. Turn the rotary switch 14 to the CKP (Crankshaft Position Sensor) position 15k.
6. With the engine running, press the stored/live button 32 to cycle between the stored reference waveform and the live waveform. If a live signal does not appear or the scope displays NO TRIG, try adjusting the trigger level up or down until a waveform is displayed. There are many different types of crankshafts position sensors, operating at different output levels and speeds such as 3x and 18x sensors. Also try adjusting the time base to a faster setting of 5 mS or 10 mS per division or adjusting the voltage to a setting of 2 V or 5 V per division. Also, make sure the test leads are making a good electrical connection.

Figure 31:
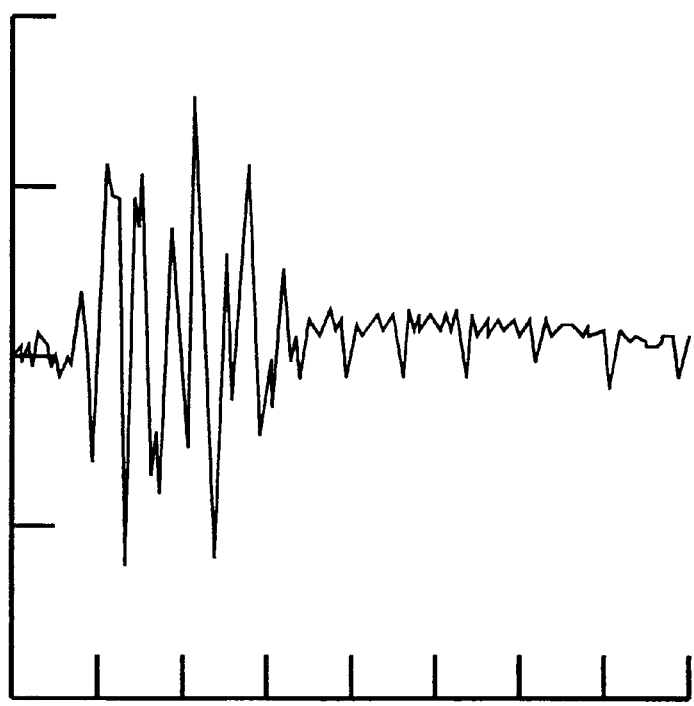
FIG. 31 is a display layout of the measuring device of FIG. 1 illustrating a knock sensor waveform.

Referring to FIG. 31, to test a Knock Sensor Output, the following steps are performed.

1. Press the ON/OFF button 20 to turn on the scope.
2. Connect one test lead to the INPUT 16 and the other test lead to the COM 18.
3. Connect the COM 18 test lead to a good ground on the engine near the sensor.
4. Connect the INPUT 16 test lead to the output of the knock sensor.
5. Turn the rotary switch 14 to the KS (Knock Sensor) position 15l.
6. Press the stored/live button 32 once to cycle between the stored reference waveform and the live waveform.
7. Gently tap the engine block near the knock sensor and observe the output of the knock sensor on the display. The engine does not need to be running or the key turned on in order to observe the output of the knock sensor. If a stopped live signal does not appear each time the engine block is gently tapped, try adjusting the trigger level up or down until a waveform is displayed. Be sure the test leads are making a good electrical connection.

Figure 32:
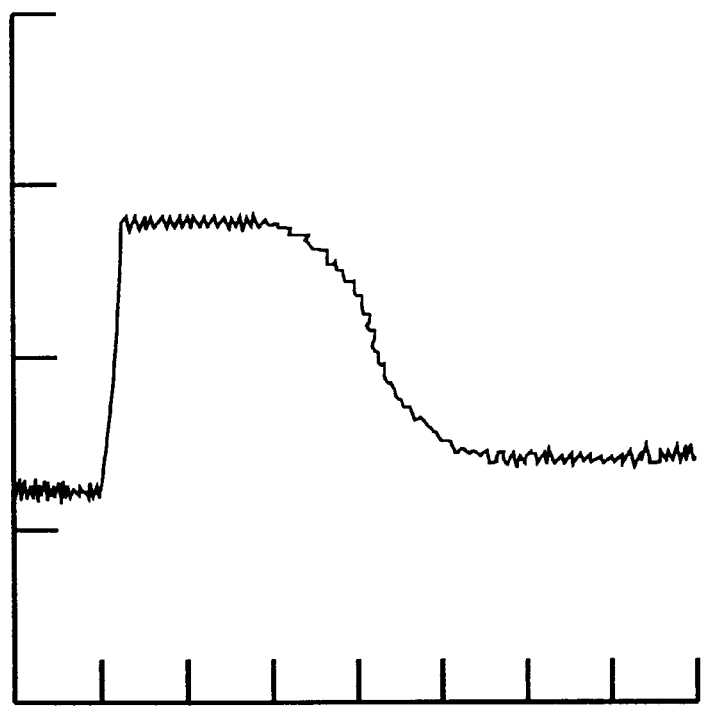
FIG. 32 is a display layout of the measuring device of FIG. 1 illustrating a manifold absolute pressure waveform.

Referring to FIG. 32, to test a Manifold Absolute Pressure Sensor Output, the following steps are performed.

1. Press the ON/OFF button 20 to turn on the scope.
2. Connect one test lead to the INPUT 16 and the other test lead to the COM 18.
3. Connect the COM 18 test lead to a good ground on the engine.
4. Connect the INPUT 16 test lead to the output of the MAP sensor.
5. Turn the rotary switch 14 to the MAP (Manifold Absolute Pressure Sensor) position 15f.
6. Press the stored/live button 32 to cycle between the stored reference waveform and the live waveform.
7. With the engine running, rapidly open and close the throttle and observe the output of the MAP sensor which shows the air pressure in the manifold rapidly changing. Make sure the test leads are making a good electrical connection.

Figure 33:
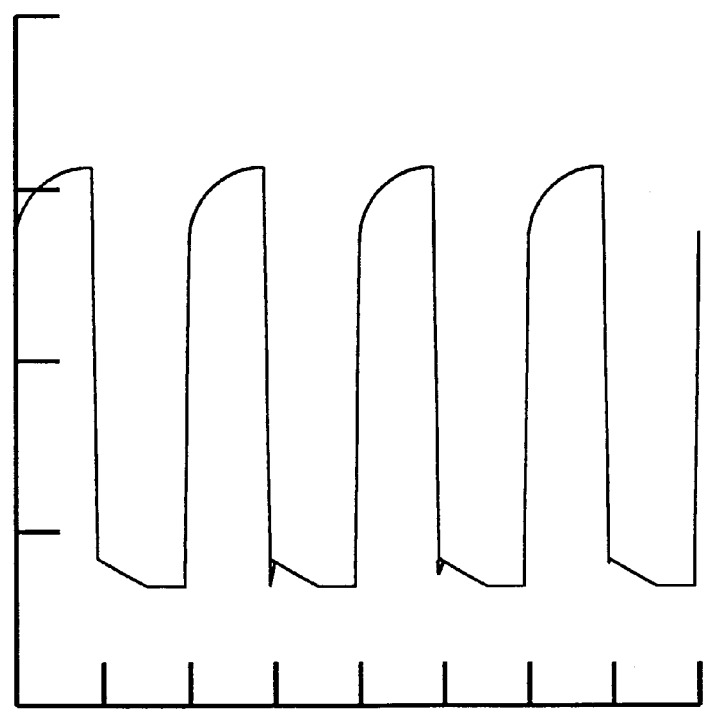
FIG. 33 is a display layout of the measuring device of FIG. 1 illustrating a mass air flow waveform.

Referring to FIG. 33, to test a Mass Air Flow Sensor Output, the following steps are performed.

1. Press the ON/OFF button 20 to turn on the scope.
2. Connect one test lead to the INPUT 16 and the other test lead to the COM 18.
3. Connect the COM 18 test lead to a good ground on the engine.
4. Connect the INPUT 16 test lead to the output of the mass air flow sensor.
5. Turn the rotary switch 14 to the MAF (Mass Air Flow Sensor) position 15c.
6. With the engine running, press the stored/live button 32 to cycle between the stored reference waveform and the live waveform. If a live signal is not seen or the scope displays NO TRIG, try adjusting the trigger level up or down until a waveform displayed. There are different types of mass air flow sensors, operating at different levels of output, such as the difference between analog and digital sensors. Also try adjusting the time base to a faster or slower setting or adjusting the voltage to a higher or lower setting per division. Also, make sure the test leads are making a good electrical connection.

Figure 34:
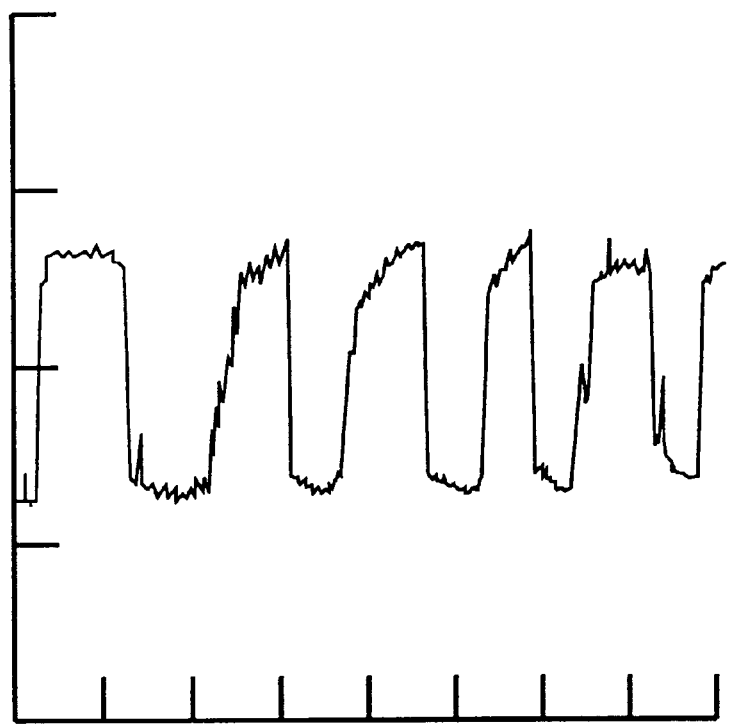
FIG. 34 is a display layout of the measuring device of FIG. 1 illustrating an O2 sensor waveform.

Referring to FIG. 34, to test an O2S Sensor Output, the following steps are performed.

1. Press the ON/OFF button 20 to turn on the scope.
2. Connect one test lead to the INPUT 16 and the other test lead to the COM 18.
3. Connect the COM 18 test lead to a good ground on the engine.
4. Connect the INPUT 16 test lead to the output of the $O_2$ sensor.
5. Turn the rotary switch 14 to the O2S sensor position 15*a*.
6. Press the stored/live button 32 to cycle between the stored reference waveform and the live waveform.
7. Observe the output of the $O_2$ sensor on the display slowly changing. The $O_2$ sensor needs to be hot and the engine must be operating in closed loop mode for the $O_2$ sensor to have the proper output. Make sure the test leads are making a good electrical connection. Because $O_2$ sensors are located in the exhaust stream they can get very hot.

Figure 35:
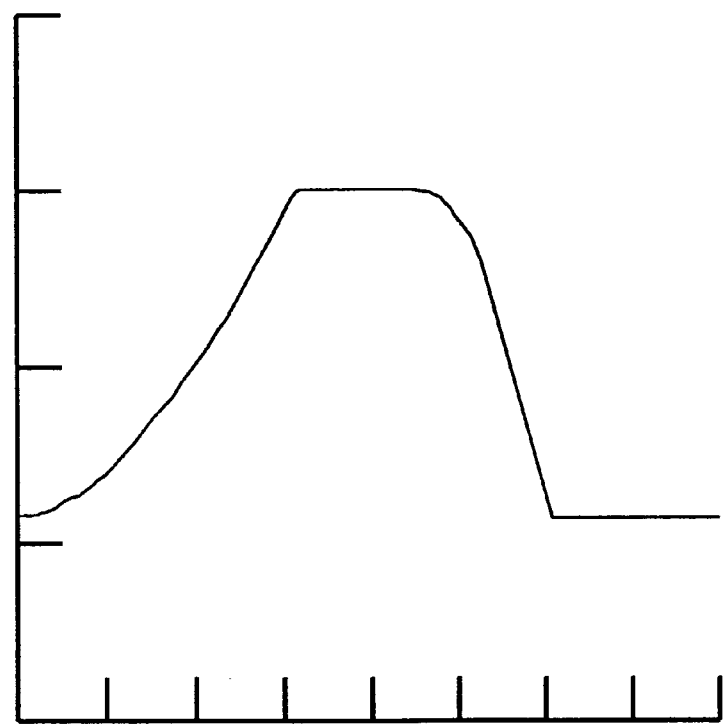
FIG. 35 is a display layout of the measuring device of FIG. 1 illustrating a throttle position sensor waveform.

Referring to FIG. 35, to test the Throttle Position Sensor Output, the following steps are performed.

1. Press the ON/OFF button 20 to turn on the scope.
2. Connect one test lead to the INPUT 16 and the other test lead to the COM 18.
3. Connect the COM 18 test lead to a good ground on the engine.
4. Connect the INPUT 16 test lead to the output of the throttle position sensor.
5. Turn the rotary switch 14 to the TP (Throttle Position Sensor) position 15*b*.
6. Press the stored/live button 32 to cycle between the stored reference waveform and the live waveform.
7. Turn the key on, do not start the engine, then rapidly open and close the throttle and observe the output of the throttle position sensor as it changes. Make sure the test leads are making a good electrical connection.

Figure 36:
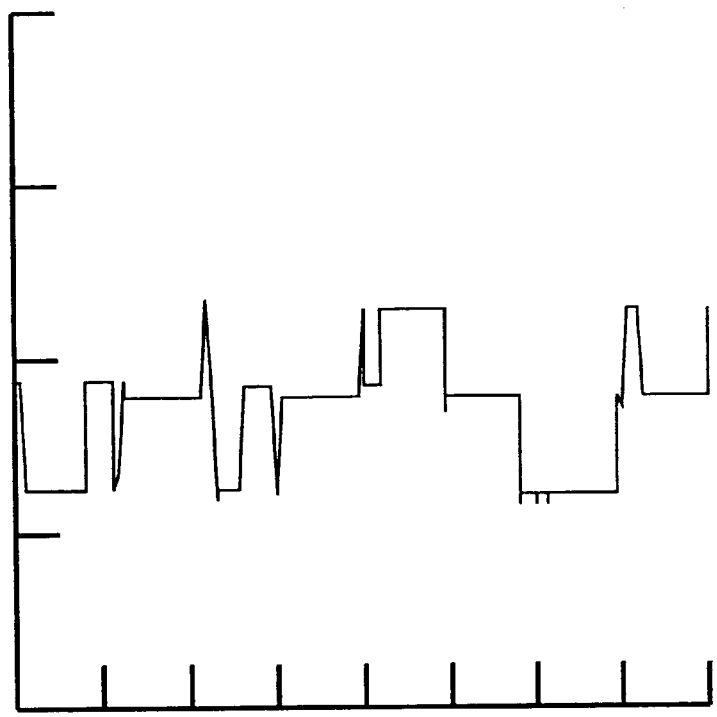
FIG. 36 is a display layout of the measuring device of FIG. 1 illustrating an idle air control waveform.

Referring to FIG. 36, to test an Idle Air Control Output, the following steps are performed.

1. Press the ON/OFF button 20 to turn on the scope.
2. Connect one test lead to the INPUT 16 and the other test lead to the COM 18.
3. Connect the COM 18 test lead to one high side output of the idle air control.
4. Connect the INPUT 16 test lead to the other high side output of the idle air control.
5. Turn the rotary switch 14 to the IAC (Idle Air Control) position 15*m*
6. With the engine running, press the stored/live button 32 to cycle between the stored reference waveform and the live waveform.
7. Rapidly open and close the throttle and observe the output of the IAC position as it changes. If a live signal does not appear or the scope displays NO TRIG, try adjusting the trigger level up or down until a waveform is displayed. Also adjust the time base to a faster or slower setting or adjust the voltage to a higher or lower setting per division. Also, make sure the test leads are making a good electrical connection.

Figure 37:
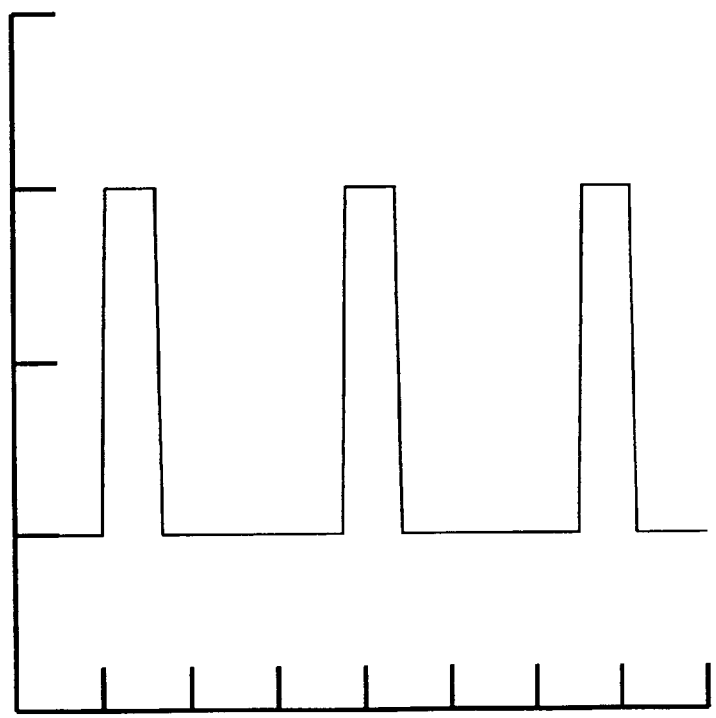
FIG. 37 is a display layout of the measuring device of FIG. 1 illustrating an ignition control waveform.

Referring to FIG. 37, to test an Ignition Control Output, the following steps are performed.

1. Press the ON/OFF button 20 to turn on the scope.
2. Connect one test lead to the INPUT 16 and the other test lead to the COM 18.
3. Connect the COM 18 test lead to a good ground on the engine.
4. Connect the INPUT 16 test lead to the output of the ignition control.
5. Turn the rotary switch 14 to the IC (Ignition Control) position 15*n*.
6. With the engine running, press the stored/live button 32 to cycle between the stored reference waveform and the live waveform. If a live signal does not appear or the scope displays NO TRIG, try adjusting the trigger level up or down until a waveform is displayed. Also adjust the time base to a faster or slower setting or adjust the voltage to a higher or lower setting per division. Also, make sure the test leads are making a good electrical connection.

Figure 38:
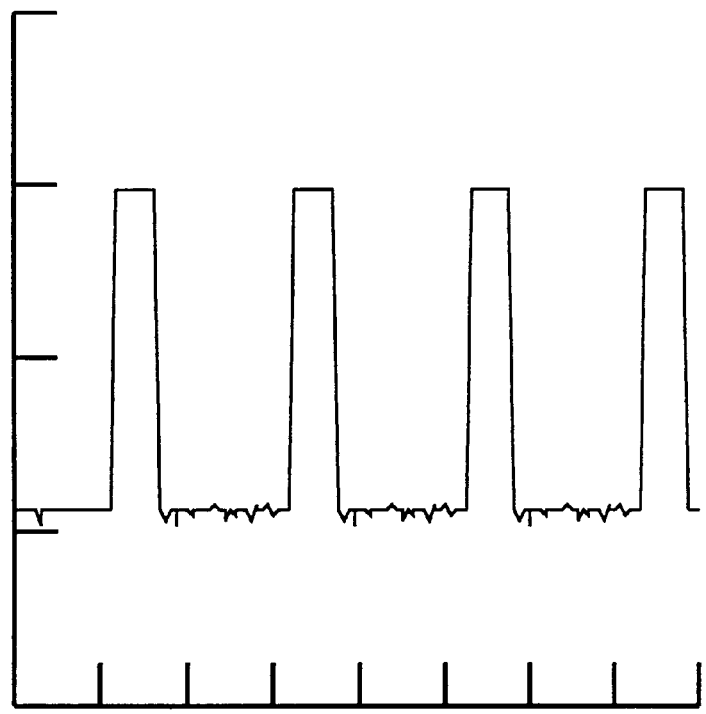
FIG. 38 is a display layout of the measuring device of FIG. 1 illustrating an ignition control module waveform.

Referring to FIG. 38, to test an Ignition Control Module Output, the following steps are performed.

1. Press the ON/OFF button 20 to turn on the scope.
2. Connect one test lead to the INPUT 16 and the other test lead to the COM 18.
3. Connect the COM 18 test lead to a good ground on the engine.
4. Connect the INPUT 16 test lead to the output of the ignition control module.
5. Turn the rotary switch 14 to the ICM (Ignition Control Module) position 15*o*.
6. With the engine running, press the stored/live button 32 to cycle between the stored reference waveform and the live waveform. If a live signal does not appear or the scope displays NO TRIG, try adjusting the trigger level up or down until a waveform is displayed. Also adjust the time base to a faster or slower setting or adjust the voltage to a higher or lower setting per division. Also, make sure the test leads are making a good electrical connection.

Figure 39:
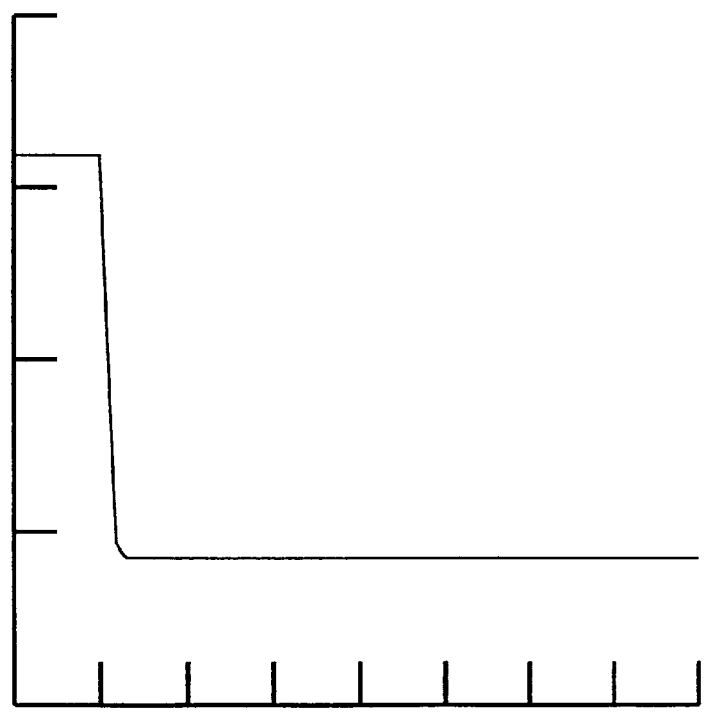
FIG. 39 is a display layout of the measuring device of FIG. 1 illustrating a torque converter clutch waveform.

Referring to FIG. 39, to test a Torque Converter Clutch Output, the following steps are performed.

1. Press the ON/OFF button to turn on scope.
2. Connect one test lead to the INPUT 16 and the other test lead to the COM 18.
3. Connect the COM 18 test lead to a good ground on the engine.
4. Connect the INPUT 16 test lead to the output of the torque converter clutch switch.
5. Turn the rotary switch 14 to the TCC (Torque Converter Clutch) position 15*p*.
6. Press the stored/live button 32 to cycle between the stored reference waveform and the live waveform.
7. With the engine running, while someone is driving, the technician can observe the torque converter clutch switch come on. Make sure the test leads are making a good electrical connection.

Figure 40:
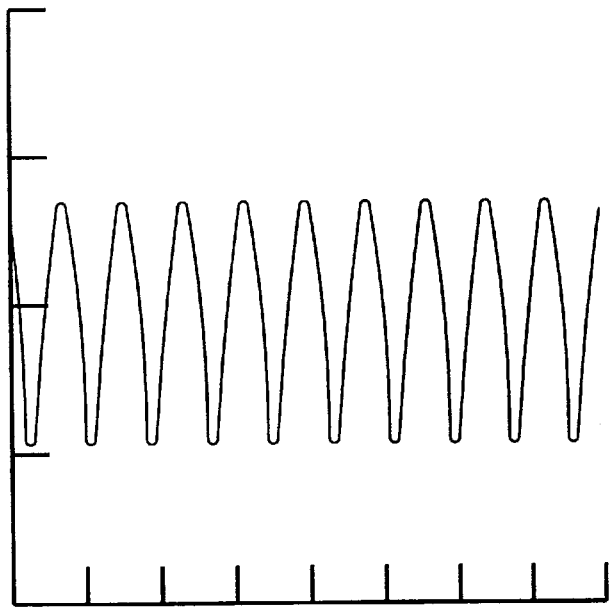
FIG. 40 is a display layout of the measuring device of FIG. 1 illustrating an anti-lock brake sensor (ABS).
Figure 43:
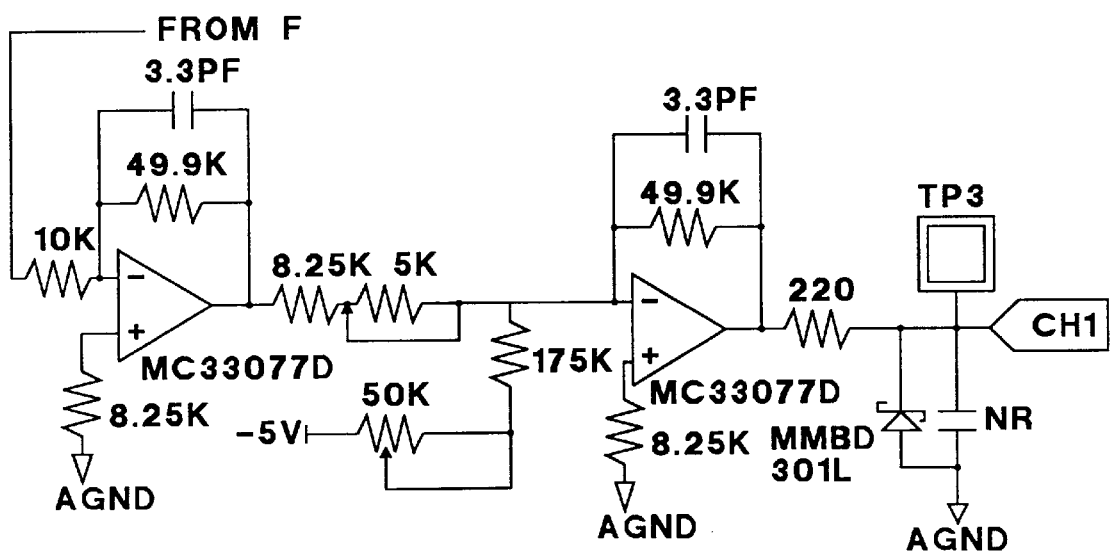
FIGS. 41–52 are circuit layouts for the measuring device of FIG. 1.
Figure 41:
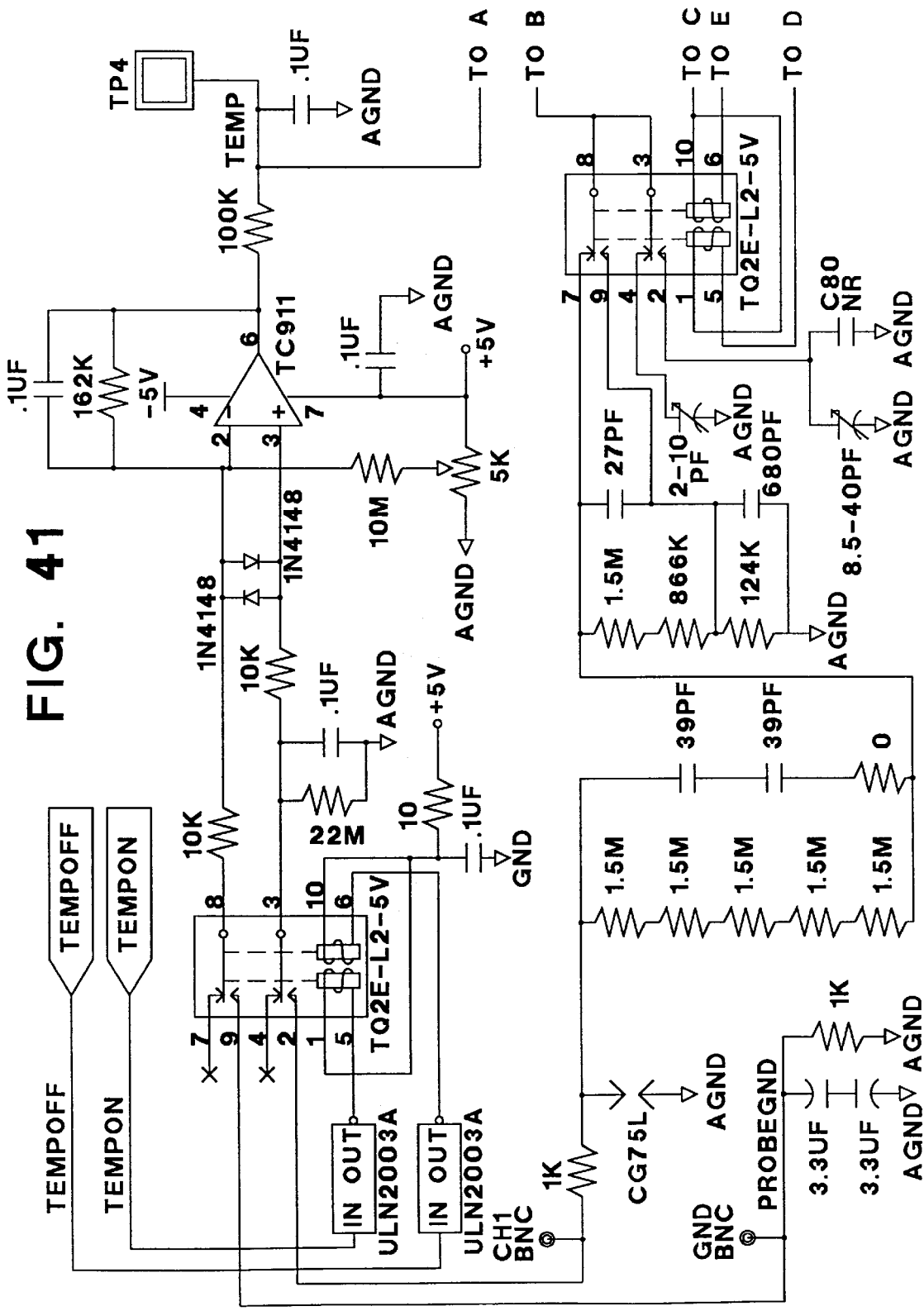
Figure 42:
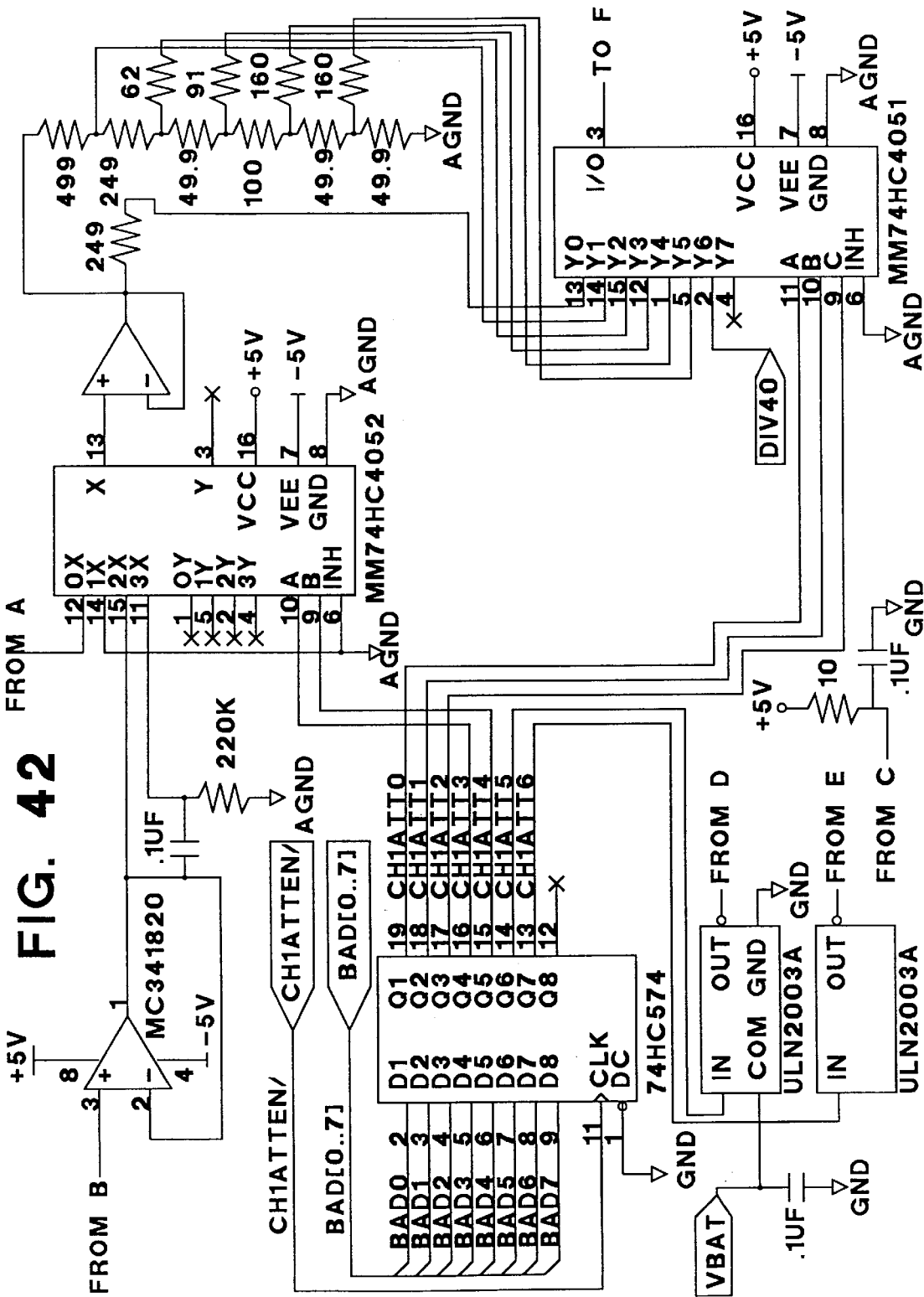
Figure 44:
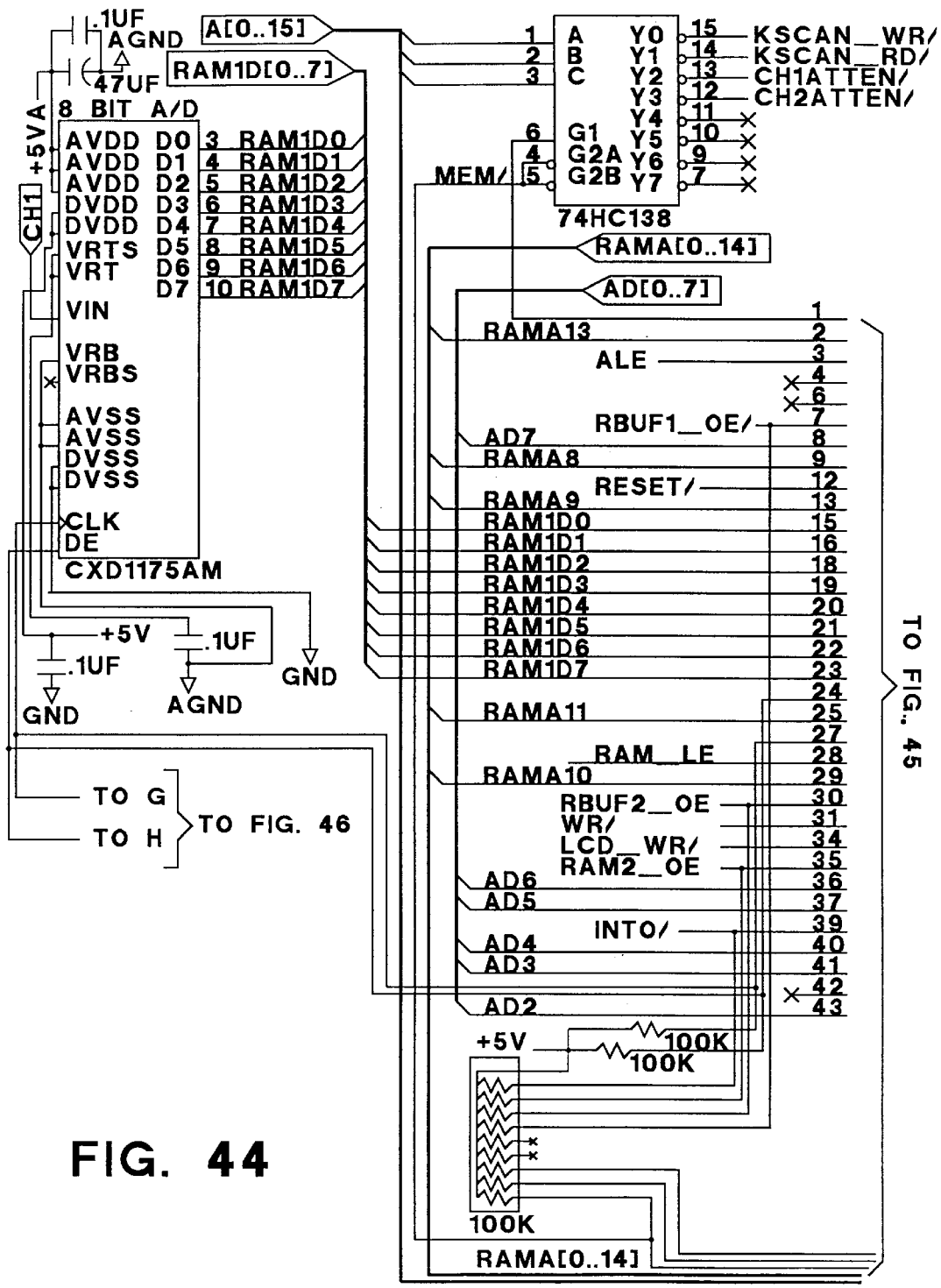
Figure 45:
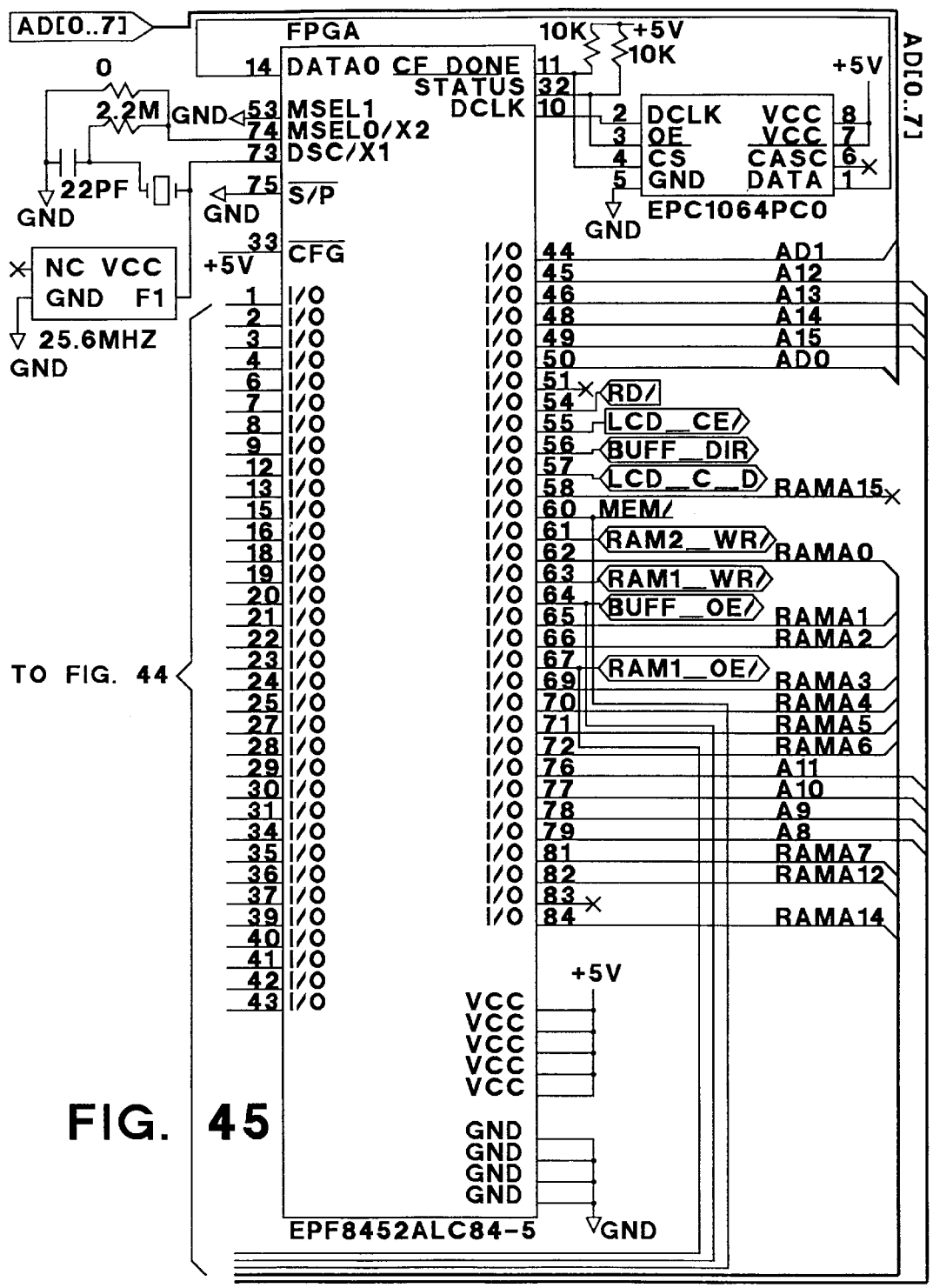
Figure 46:
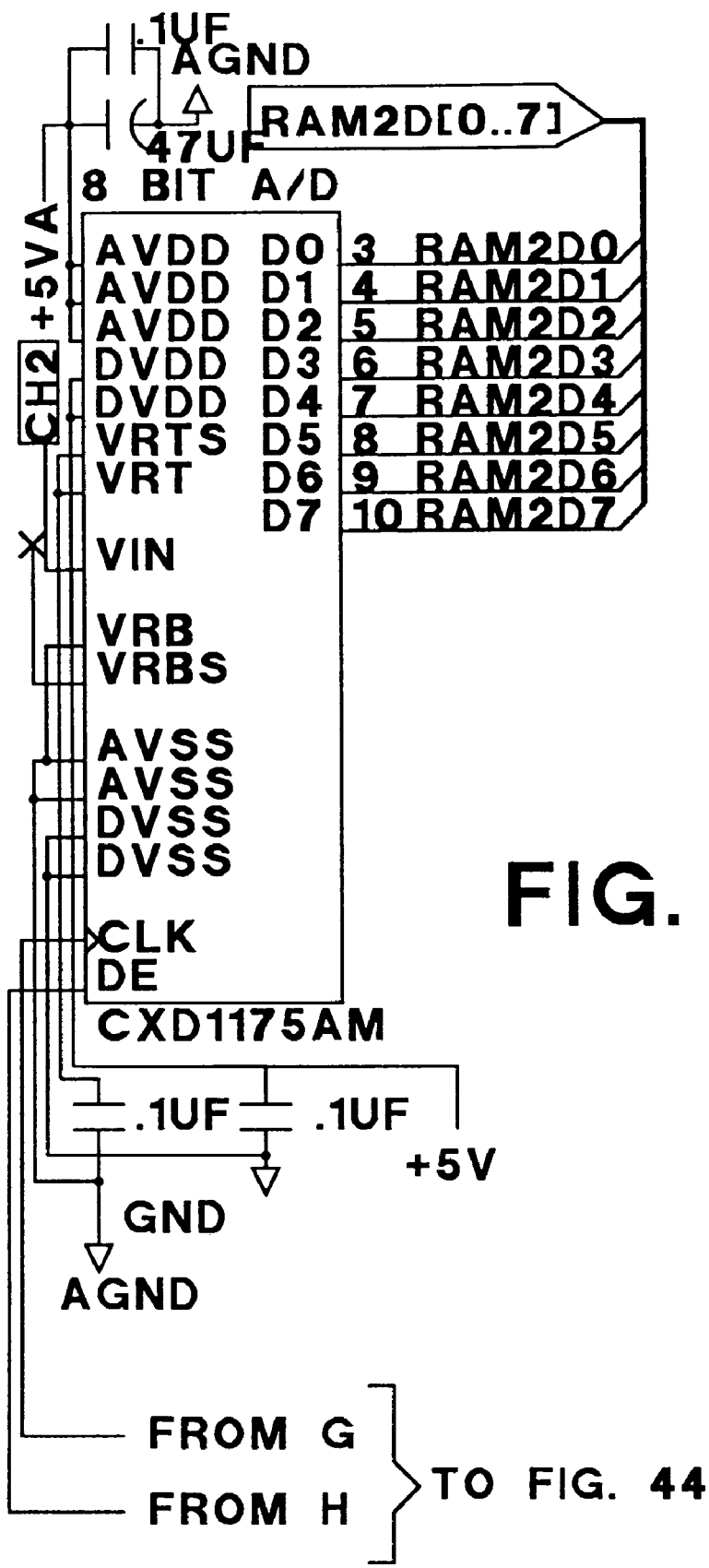
Figure 47:
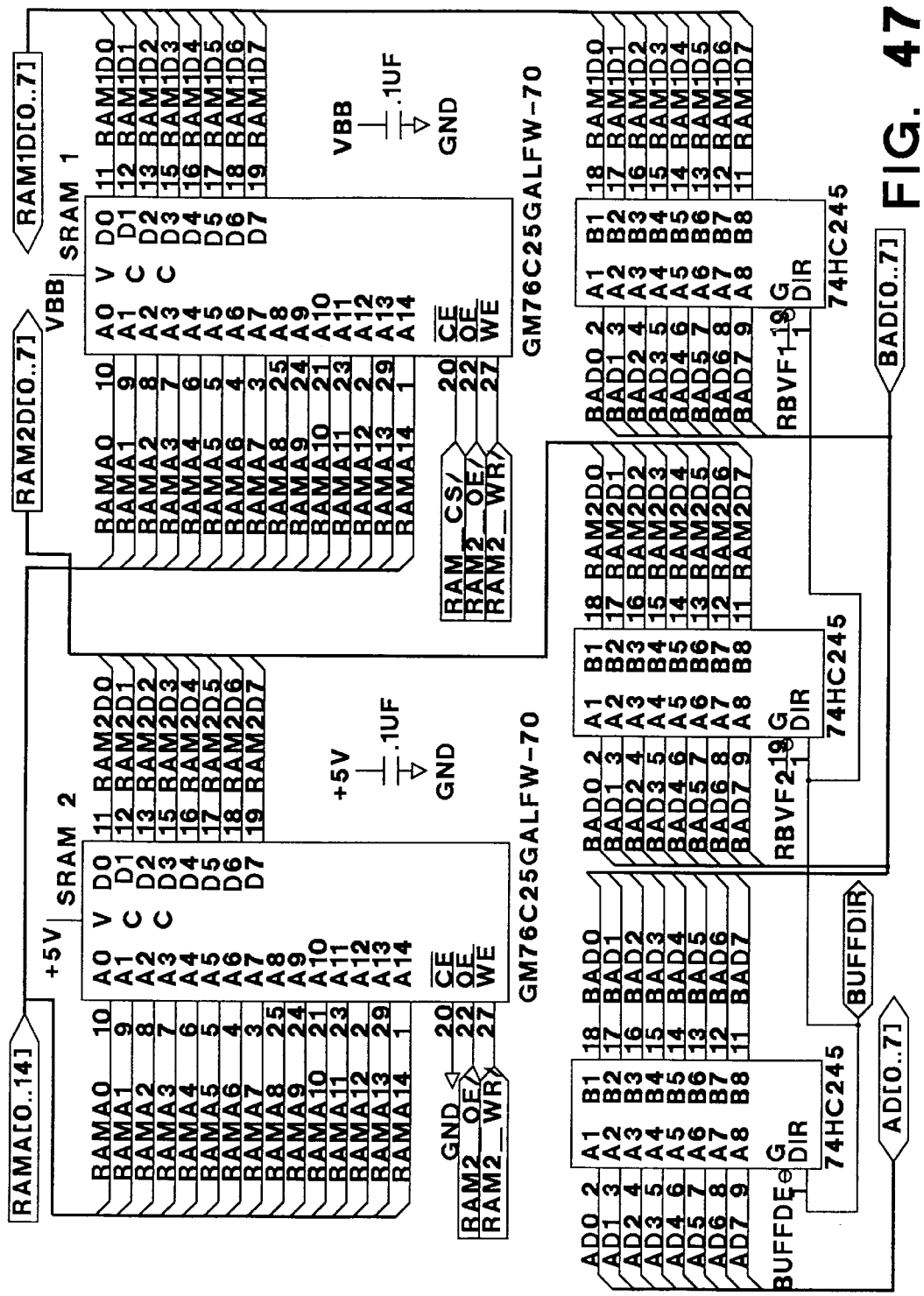
Figure 48:
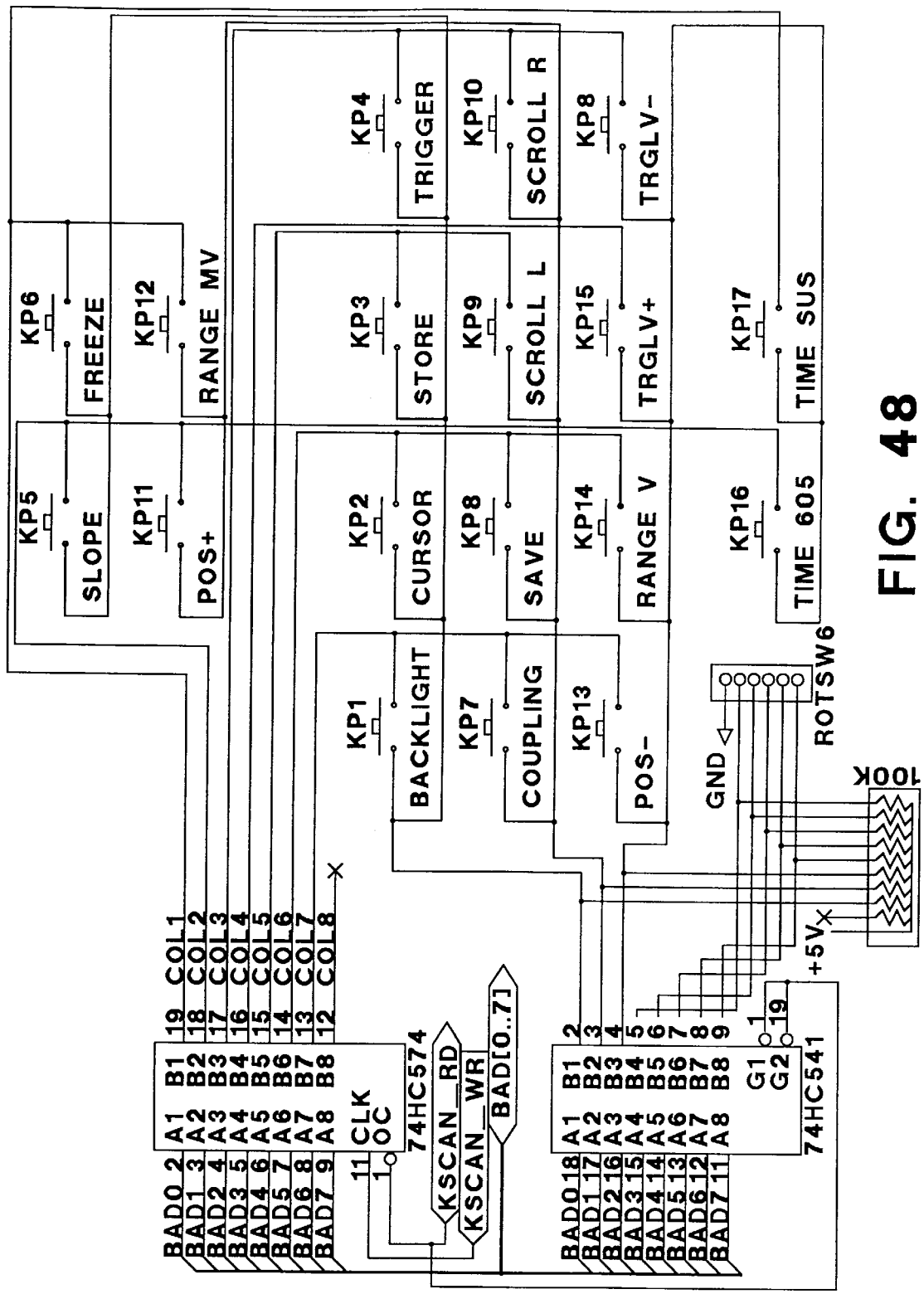
Figure 49:
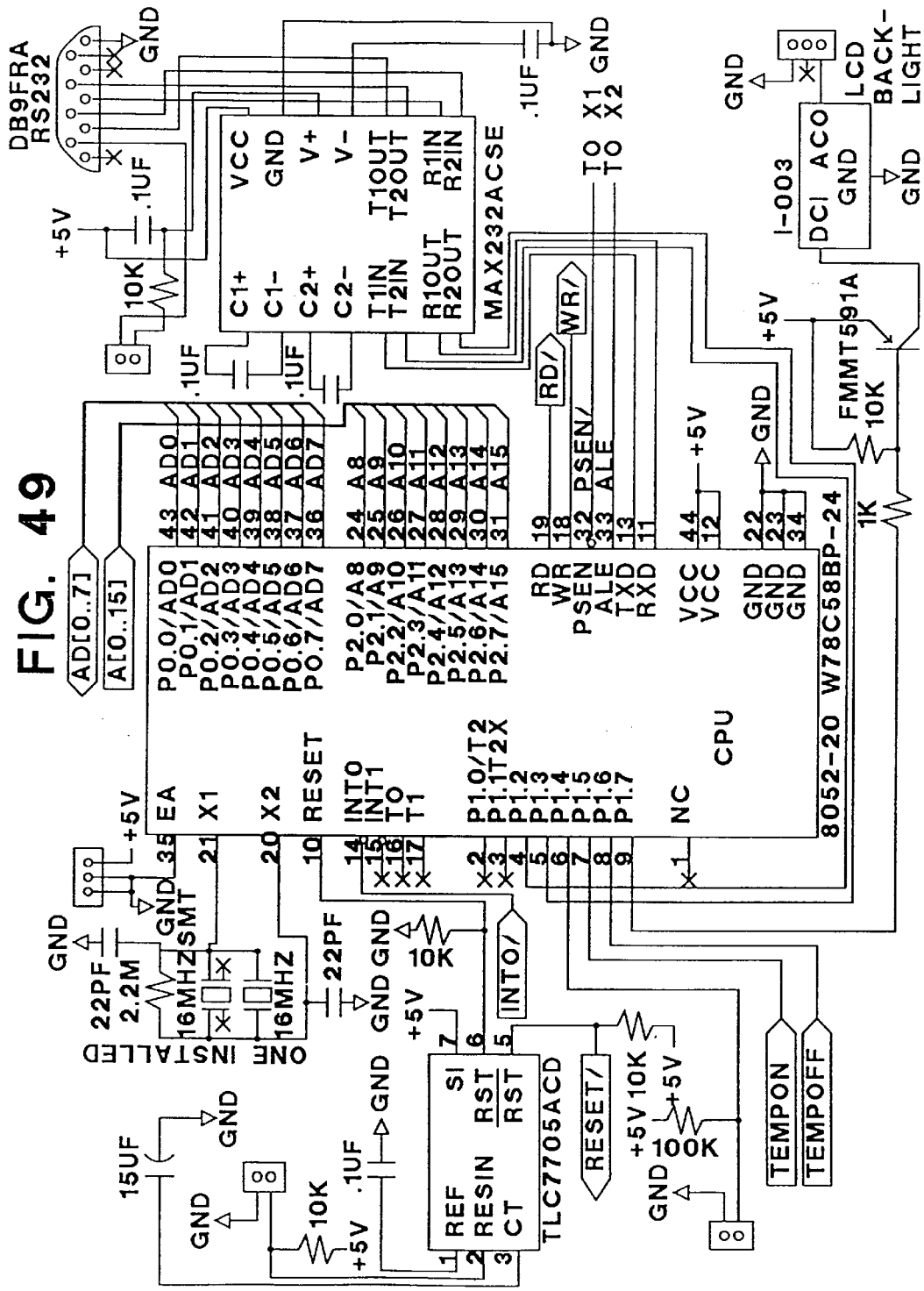
Figure 50:
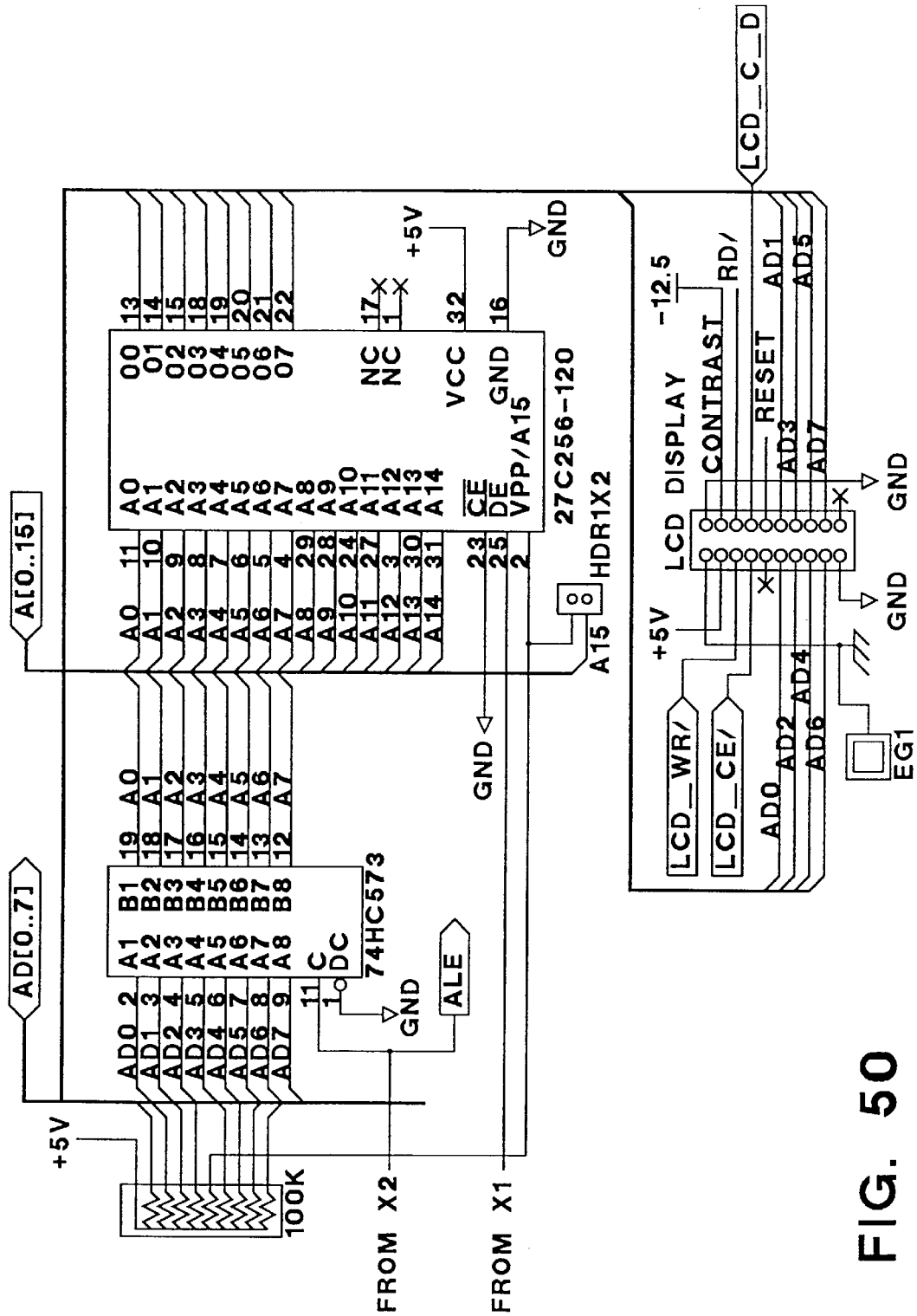
Figure 51:
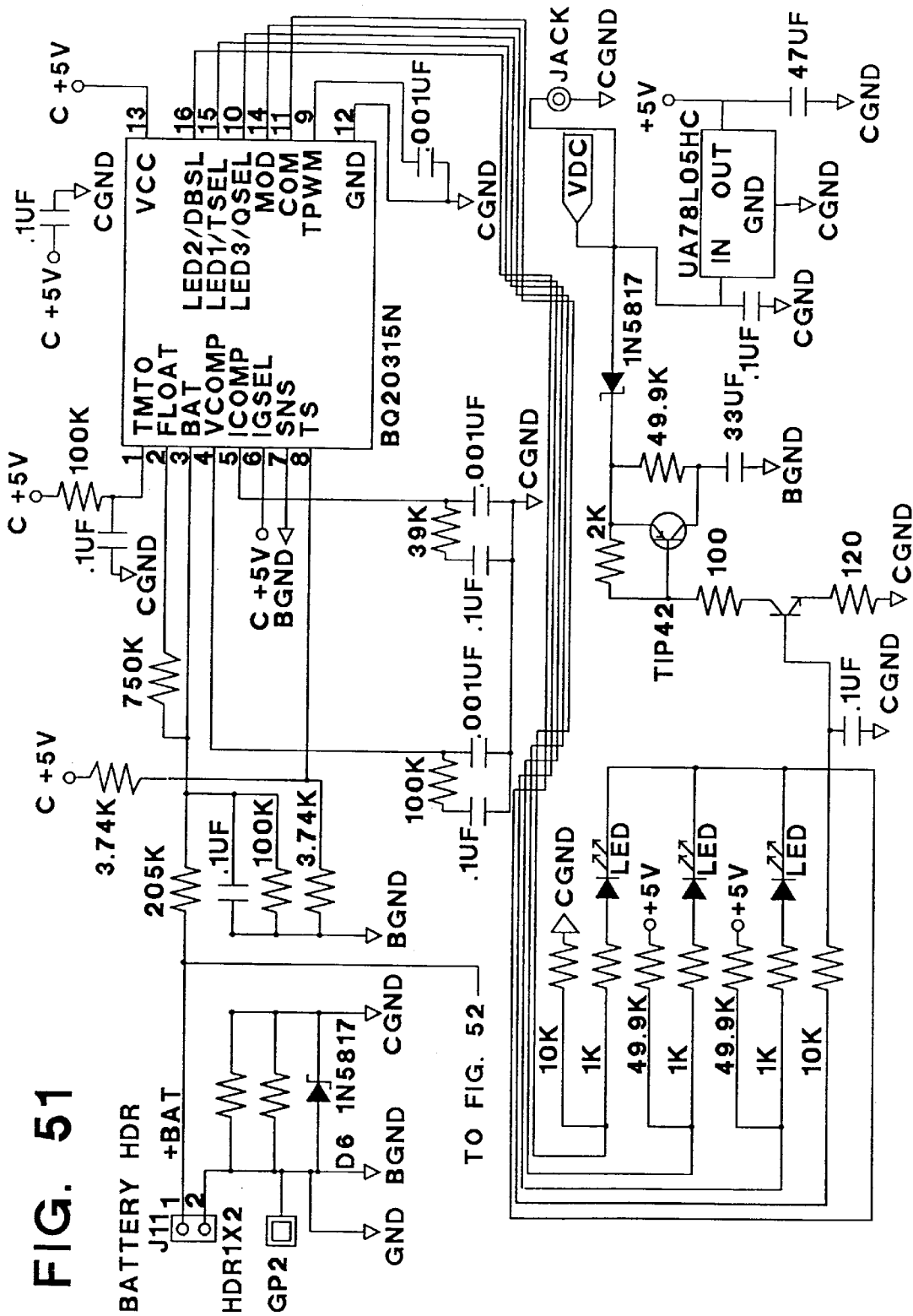
Figure 52:
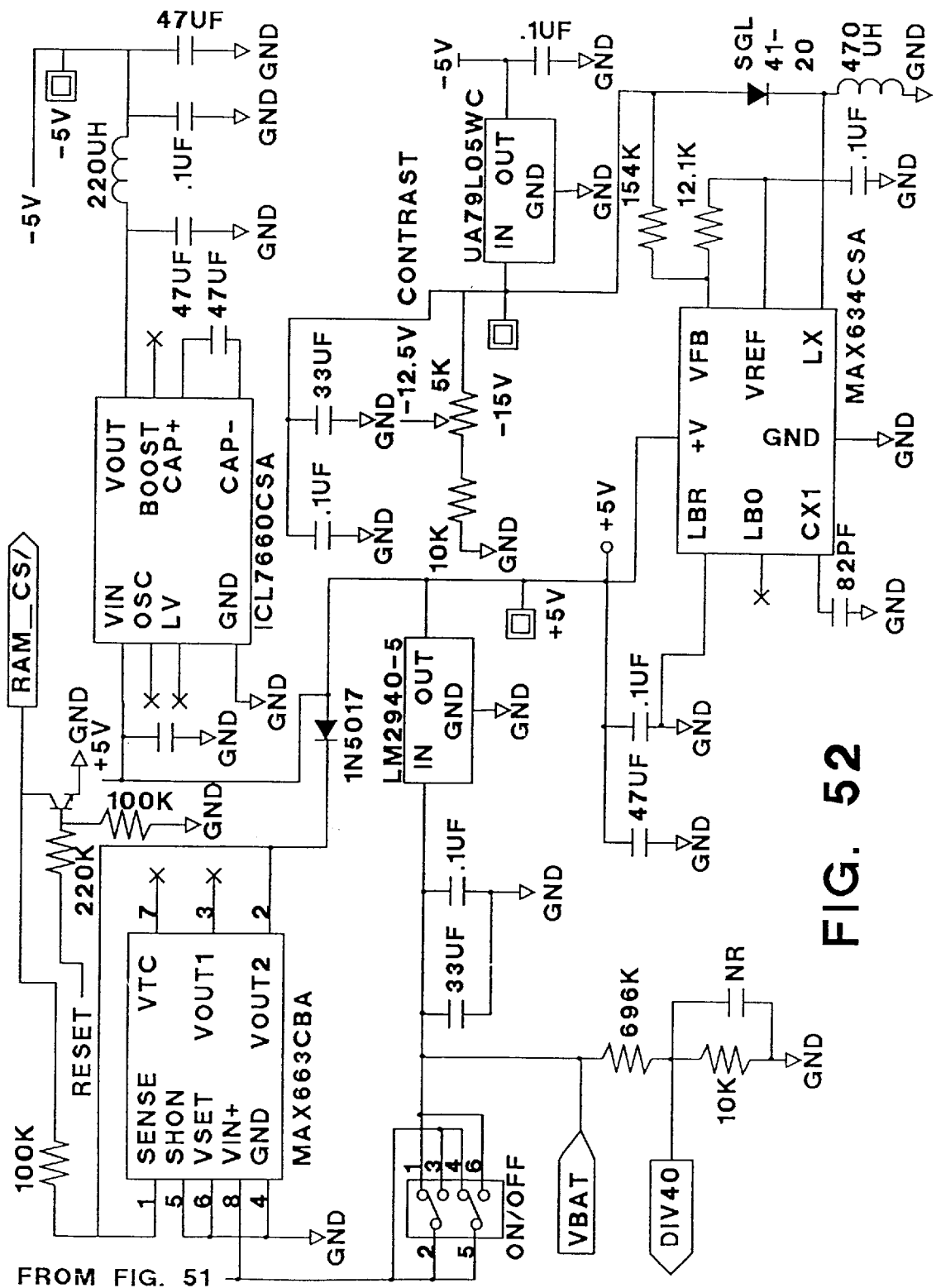

Referring to FIG. 40, to test an Anti-Lock Brake Wheel Speed Sensor Output, the following steps are performed.

1. Press the ON/OFF button 20 to turn on the scope.
2. Connect one test lead to the INPUT 16 and the other test lead to the COM 18.
3. Connect the COM 18 test lead to one side of the wheel speed sensor.
4. Connect the INPUT 16 test lead to the other side of the wheel speed sensor.
5. Turn the rotary switch 14 to the ABS (Anti-Lock Brake) position 15r.
6. Press the stored/live button 32 to cycle between the stored reference waveform and the live waveform.
7. With the vehicle up on a lift, rotate the wheel by hand and observe the output of the wheel speed sensor on the display. The engine does not need to be running or the key turned on in order to observe the output of the wheel speed sensor. If a live signal is not observed each time the wheel is rotated, adjust the trigger level up or down until a waveform is displayed.

To save a waveform to memory locations 1 through 4 (15s, 15t, 15u, 15v), the following steps are performed.
1. Press the ON/OFF button 20 to turn on the scope.
2. Connect one test lead to the INPUT 16 and the other test lead to the COM 18.
3. Connect the COM 18 test lead and INPUT 16 test lead to the signal to be stored.
4. Turn the rotary switch 14 to the appropriate position to acquire the waveform or manually configure the scope settings in the lab scope position 15q.
5. Press the stored/live button 32.
6. When the waveform to be stored is observed, press the freeze/run button 32 once to freeze the waveform. A 0 will appear at the bottom of the display to indicate that the displayed waveform is the middle stored waveform of 9 waveforms, 4 prior and 4 after.
7. Rotate the switch 14 to one of the memory positions MEM1–MEM4 (15s, 15t, 15u, 15v) and press the save button 43 to store the waveform and front panel settings in that location.
8. The waveform and front panel settings are now stored in that location until overwritten in that location or the battery is removed.

The use of a training position 15w with an automotive signal generator (not shown) is described below.
1. Press the ON/OFF button 20 to turn on the scope.
2. Connect one test lead to the INPUT 16 and the other test lead to the COM 18.
3. Turn on the signal generator.
4. Connect the COM 18 test lead to the generator.
5. Connect the INPUT 16 test lead to the generator.
6. Turn the rotary switch 14 to the TRNG (TRAINING) position 15w.
7. Press the stored/live button 32 to cycle between the stored reference waveform and the live waveform. If a live signal appears or the scope displays NO TRIG, try adjusting the trigger level up or down until a waveform is displayed. Also try adjusting the time base to a faster or slower setting or adjusting the voltage to a higher or lower setting per division. Also, make sure the test leads are making a good electrical connection.

To use an INFO position 15x, the following is performed.
1. Press the ON/OFF button 20 to turn on the scope.
2. Turn the rotary switch 14 to the INFO position 15x.
3. Press the scroll button 35 to the right to go forward through the list of OBDII definitions and press the scroll button 35 to the left to go backward through the list of OBDII definitions.
4. To return to normal scope operation, turn the rotary switch 14 to any other position.

To use the lab scope position 15q, the following is performed.
1. Press the ON/OFF button 20 to turn on the scope.
2. Turn the rotary switch 14 to the lab scope position 15q. When using the scope in the lab scope position 15q one must manually configure all of the scope settings, as previously described. The default settings in this position are auto trigger, positive slope, 1.5 volt trigger level, 5 volts per division, 5 mS per division, and DC coupled.
3. Connect one test lead to the INPUT 16 and the other test lead to the COM 18.
4. Connect the COM 18 test and input 18 test lead to the signal to view.
5. Adjust the volts per division, position, time per division, trigger level, trigger slope, and trigger mode to the appropriate settings to acquire the waveform.

Personal computer (PC) based software suitable to be used with the scope through a serial interface provides the following capabilities:
view waveforms on a larger PC screen;
compare and measure waveforms on the PC screen;
print out waveforms on a PC printer;
control the front panel settings of the scope from the PC;
control the operation of the scope from the PC;
save and recall up to four waveforms in the PC's data base management system;
store and retrieve an unlimited number of waveforms in the data base management system (DBMS);
store and retrieve waveforms by special key words (e.g., GM-Pontiac-GTO-1966-Ignition-Version2-Fault15);
families of reference waveforms can be built (or purchased) to meet the requirements of particular working environments; and
test waveforms can be defined, saved, and recalled to save time during setup and test.

The additional data base capabilities provided by the PC based software enables the storage, retrieval, and comparison of many additional waveforms and automates the procedures by setting up predefined test waveforms.

To run the PC software the scope is connected to a serial part on the PC.

The acquisition menu in the PC software provides the user with access to the following functions:
Continuous display and continuously update an acquired waveform on the PC screen and the acquired waveform must first be visible on the scope screen.
Waveform acquire and display an acquired wave; Load Ref Waves load and display a stored wave from the PC's memory data base; and
Save Waveforms save the displayed wave as a reference wave in the PC's memory data base.

The PC software provides the user with a complete computer based data base management system (DBMS). A DBMS is a system to store, search, maintain, and recall data based upon certain predefined key words. For example, a set of telephone books for the USA is a DBMS. A person's name is stored along with their address and telephone number. Each set of data is known as a record. The data to be recalled is the address and telephone number of the person of interest.

The key words required to find this person's data, in order, are as follows:

Country (USA—implied)
Regional Area (Ithaca, N.Y.)
Type (Yellow Pages, White Pages)
Last Name
First Name This same data base can be organized in many different ways. For example, emergency service organizations usually have this same telephone book data and are able to use a telephone number as a key word to find the name and location of a particular telephone. To provide books or lists on paper limits the way data can be stored and retrieved to the order in which they were originally printed. The other major problem with printed data bases is keeping the records up to date. In a normal telephone book it is impractical to find a particular name and address given that you know only the telephone number. One needs the key words and data stored in a different order or sorted by the telephone number. For example, people move in and out of an area, their telephone numbers change. These changes make the data base useless if data is needed that has changed since the last printing..

This is where the computer is a fast tool for ordering or sorting, searching, and changing various data in a data base, such as by the DBMS. The PC software has the capability to store, search, and recall automotive wave data.

The PC software provides the user with seven key word fields. These key word fields are predefined but may be changed to meet specific requirements.

Make (example—GM, Ford, etc.)
Model (example—Pontiac, Escort, etc.)
Year (example—1988, 1996, etc.)
Type (example—GTO, LXI, etc.)
Test Point (example—Idle Control, Ignition, etc.)
Serial # (example—E654-87-99, 000023, etc.)
Sample (example—Customer Name, 001, etc.)

The data that is stored and recalled using these key words is made up of both the waveform and front panel scope settings associated with the waveform. When this waveform data is recalled, it appears on the PC screen in the same manner as a scope memory waveform.

The significant difference between waveforms saved in the scope's memory and the waveforms saved in the PC's DBMS is that the key words are saved along with the waves in the DBMS (an entire record). This allows saving the specific identifying detail of any waveform for later recall and use.

For example, this feature could allow recalling Mr. Butler's 1987 Ford Escort's Idle Control waveform from his last visit and then compare that to the standard Idle Control waveforms for all Ford Escorts from 1985 through 1989 and then compare those with Mr. Butler's 1987 Ford Escort's Idle Control wave from his current visit.

Referring to FIGS. 41–52 the circuit layouts for the measuring device of FIG. 1 are shown.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A measuring device for displaying waveforms representative of electrical signals from a device under test includes a selector, at least one input terminal, and a graphical display, said measuring device comprising:

(a) said graphical display suitable to display a waveform thereon;

(b) a storage device containing a plurality of waveform data sets, each of said waveform data sets having respective trigger data for measuring said electrical signals and scaling data, at least two of said waveform data sets having different values for both respective trigger data and scaling data;

(c) a measuring module adapted to receive an electrical input signal from said input terminal free from a response to a stimulus from said measuring device to said device under test from which said electrical input signal is received;

(d) said selector rotatable to one of a plurality of positions;

(e) said measuring device selects a different waveform data set in response to said selector being rotated to each of said positions;

(f) said measuring device configures said measuring module with trigger data from said waveform data set corresponding to said position of said selector;

(g) said measuring module compares said electrical input signal with said trigger data corresponding to said position of said selector and generates a received waveform representative of said electrical input signal in response to at least one of said electrical input signal being greater than said trigger data corresponding to said position of said selector and being less than said trigger data corresponding to said position of said selector;

(h) said measuring device automatically configures said graphical display in accordance with said scaling data corresponding to said position of said selector based only in response to said selector being rotated to said one of said plurality of positions; and (i) said graphical display displays said received waveform.

2. The measuring device of claim 1 further comprising:

(a) each of said waveform data sets further includes respective graphical data for a referenced waveform;

(b) said measuring device automatically selects said graphical data corresponding to said position of said selector only in response to said selector being rotated to said one of said plurality of positions; and (c) said graphical display displays said referenced waveform corresponding to said position of said selector.

3. The measuring device of claim 2 wherein said received waveform and said referenced waveform are displayed on different portions of said graphical display.

4. The measuring device of claim 1 wherein each of said trigger data includes a trigger slope value.

5. The measuring device of claim 1 wherein each of said trigger data includes a trigger level voltage.

* * * * *